US012718126B2

(12) United States Patent
Yuan et al.

(10) Patent No.: US 12,718,126 B2
(45) Date of Patent: Aug. 25, 2026

(54) METHODS AND APPARATUSES FOR GENERATING QUANTUM STATE PREPARATION CIRCUIT AND PREPARING QUANTUM STATE AND QUANTUM CHIP

(71) Applicant: Tencent Technology (Shenzhen) Company Limited, Shenzhen (CN)

(72) Inventors: Pei Yuan, Shenzhen (CN); Shengyu Zhang, Shenzhen (CN)

(73) Assignee: TENCENT TECHNOLOGY (SHENZHEN) COMPANY LIMITED, Shenzhen (CN)

( * ) Notice: Subject to any disclaimer, the term of this patent is extended or adjusted under 35 U.S.C. 154(b) by 680 days.

(21) Appl. No.: 18/212,777

(22) Filed: Jun. 22, 2023

(65) Prior Publication Data

US 2023/0376815 A1 Nov. 23, 2023

Related U.S. Application Data

(63) Continuation of application No. PCT/CN2023/086794, filed on Apr. 7, 2023.

(30) Foreign Application Priority Data

May 18, 2022 (CN) ........................ 202210542256.X

(51) Int. Cl.

| | |
|---|---|
| ***G06F 30/32*** | (2020.01) |
| ***G06F 30/327*** | (2020.01) |
| ***G06N 10/20*** | (2022.01) |

(52) U.S. Cl.

CPC ........... *G06N 10/20* (2022.01); *G06F 30/327* (2020.01)

(58) Field of Classification Search

USPC ................................ 716/100, 101, 104, 106

See application file for complete search history.

(56) References Cited

U.S. PATENT DOCUMENTS

2020/0125985 A1* 4/2020 Narang .................. G06N 10/60
2022/0067562 A1* 3/2022 Morehead ................ G06F 1/08

(Continued)

FOREIGN PATENT DOCUMENTS

CN 113168582 A 7/2021
CN 113222165 A 8/2021

(Continued)

OTHER PUBLICATIONS

Japanese Office Action with English translation regarding 2023-554051 dated Jul. 23, 2024, 6 pages.

(Continued)

*Primary Examiner* — Brian Ngo

(74) *Attorney, Agent, or Firm* — Crowell & Moring LLP

(57) ABSTRACT

The present disclosure relates to a method and apparatus for generating a quantum state preparation circuit, a quantum chip, an electronic device, a storage medium, and a computer program product. The method includes: determining a target qubit set with a binary tree restriction and applying a single qubit flip gate to a first target sub-node qubit; applying a two-qubit phase offset gate between sub-node qubits; applying a two-qubit SWAP gate between the first target sub-node qubit and a second target sub-node qubit; taking the sub-node qubits as the root node qubit and iteratively performing until the sub-node qubits are leaf node qubits; and applying the two-qubit phase offset gate with a path restriction between leaf node qubits and applying a single qubit phase offset gate to the leaf node qubits to obtain a quantum state preparation circuit.

20 Claims, 12 Drawing Sheets

(56) References Cited

U.S. PATENT DOCUMENTS

| | | | | |
|---|---|---|---|---|
| 2022/0164505 | A1* | 5/2022 | Mosca | G06F 30/327 |
| 2023/0093578 | A1* | 3/2023 | Ruskuc | G06N 10/20 |
| | | | | 716/100 |

FOREIGN PATENT DOCUMENTS

| | | | |
|---|---|---|---|
| CN | 113592093 | | 11/2021 |
| CN | 113807525 | A | 12/2021 |
| CN | 114444704 | A | 5/2022 |
| JP | 2022-510138 | A | 1/2022 |
| WO | WO 2021206872 | A1 | 10/2021 |

OTHER PUBLICATIONS

International Search Report with English translation and Written Opinion regarding PCT/CN2023/086794 dated Jul. 20, 2023, 9 pages.

* cited by examiner

METHODS AND APPARATUSES FOR GENERATING QUANTUM STATE PREPARATION CIRCUIT AND PREPARING QUANTUM STATE AND QUANTUM CHIP

RELATED APPLICATION

This application is a continuation application of PCT Patent Application No. PCT/CN2023/086794, filed on Apr. 7, 2023, which claims priority to Chinese Patent Application No. 202210542256.X, filed to China National Intellectual Property Administration on May 18, 2022, both of which are incorporated herein by reference in their entireties.

FIELD OF THE TECHNOLOGY

The present disclosure relates to the field of a quantum technology, and in particular, to methods and apparatuses for generating a quantum state preparation circuit and preparing a quantum state, a quantum chip, an electronic device, a storage medium, and a computer program product.

BACKGROUND OF THE DISCLOSURE

With the growth of a quantum technology, the technology of preparing a quantum state appears. A process of loading classic data into a quantum state is referred to as quantum state preparation. In a quantum system, if the depth of a quantum circuit is too great, the quantum circuit will degenerate into the classic circuit due to the decoherence of the quantum. In a practical quantum device, the spatial arrangement of qubits or other reasons may limit the interaction between the qubits. Therefore, in a quantum state preparation circuit, the qubits on which a CNOT gate (a two-qubit gate) can act are limited by a particular physical device.

The circuit depth is greatly increased by directly improving the existing quantum state preparation circuit with a circuit restriction.

The present disclosure describes embodiments for generating a quantum state preparation circuit addressing at least one of the problems/issues associated with quantum state preparation, improving the quantum computing and/or quantum information process field.

SUMMARY

Based on the above description, it is necessary to provide methods and apparatuses for generating a quantum state preparation circuit and preparing a quantum state, a quantum chip, an electronic device, a storage medium, and a computer program product that can effectively reduce the circuit depth in view of the above technical problems.

The present disclosure describes a method for generating a quantum state preparation circuit. The method is executed by an electronic device including a memory storing instructions and a processor in communication with the memory. The method includes acquiring a single qubit flip gate, a single qubit phase offset gate, a two-qubit SWAP gate, and a two-qubit phase offset gate with a path restriction; determining a target qubit set with a binary tree restriction and applying the single qubit flip gate to a first target sub-node qubit corresponding to a root node qubit in the target qubit set to obtain a flip gate sub-circuit; applying the two-qubit phase offset gate between sub-node qubits corresponding to the root node qubit to obtain a phase offset gate sub-circuit; applying the two-qubit SWAP gate between the first target sub-node qubit and a second target sub-node qubit to obtain a SWAP gate sub-circuit, the second target sub-node qubit being a sub-node qubit of the first target sub-node qubit; taking a sub-node qubit of the root node qubit as a next root node qubit and performing the applying the two-qubit phase offset gate between sub-node qubits corresponding to the next root node qubit to obtain a phase offset gate sub-circuit until the sub-node qubits are leaf node qubits; applying the two-qubit phase offset gate with a path restriction between leaf node qubits corresponding to parent node qubits in the target qubit set to obtain a leaf phase offset gate sub-circuit and applying the single qubit phase offset gate to the leaf node qubits to obtain a single qubit phase offset sub-circuit; and combining the flip gate sub-circuit, the phase offset gate sub-circuit, the SWAP gate sub-circuit, the leaf phase offset gate sub-circuit, and the single qubit phase offset sub-circuit into a quantum state preparation circuit.

The present disclosure describes an apparatus for generating a quantum state preparation circuit. The apparatus includes a memory storing instructions; and a processor in communication with the memory. When the processor executes the instructions, the processor is configured to cause the apparatus to perform: acquiring a single qubit flip gate, a single qubit phase offset gate, a two-qubit SWAP gate, and a two-qubit phase offset gate with a path restriction; determining a target qubit set with a binary tree restriction and applying the single qubit flip gate to a first target sub-node qubit corresponding to a root node qubit in the target qubit set to obtain a flip gate sub-circuit; applying the two-qubit phase offset gate between sub-node qubits corresponding to the root node qubit to obtain a phase offset gate sub-circuit; applying the two-qubit SWAP gate between the first target sub-node qubit and a second target sub-node qubit to obtain a SWAP gate sub-circuit, the second target sub-node qubit being a sub-node qubit of the first target sub-node qubit; taking a sub-node qubit of the root node qubit as a next root node qubit and performing the applying the two-qubit phase offset gate between sub-node qubits corresponding to the next root node qubit to obtain a phase offset gate sub-circuit until the sub-node qubits are leaf node qubits; applying the two-qubit phase offset gate with a path restriction between leaf node qubits corresponding to parent node qubits in the target qubit set to obtain a leaf phase offset gate sub-circuit and applying the single qubit phase offset gate to the leaf node qubits to obtain a single qubit phase offset sub-circuit; and combining the flip gate sub-circuit, the phase offset gate sub-circuit, the SWAP gate sub-circuit, the leaf phase offset gate sub-circuit, and the single qubit phase offset sub-circuit into a quantum state preparation circuit.

The present disclosure describes a non-transitory computer-readable storage medium, storing computer-readable instructions. The computer-readable instructions, when executed by a processor, are configured to cause the processor to perform: acquiring a single qubit flip gate, a single qubit phase offset gate, a two-qubit SWAP gate, and a two-qubit phase offset gate with a path restriction; determining a target qubit set with a binary tree restriction and applying the single qubit flip gate to a first target sub-node qubit corresponding to a root node qubit in the target qubit set to obtain a flip gate sub-circuit; applying the two-qubit phase offset gate between sub-node qubits corresponding to the root node qubit to obtain a phase offset gate sub-circuit; applying the two-qubit SWAP gate between the first target sub-node qubit and a second target sub-node qubit to obtain a SWAP gate sub-circuit, the second target sub-node qubit being a sub-node qubit of the first target sub-node qubit; taking a sub-node qubit of the root node qubit as a next root node qubit and performing the applying the two-qubit phase offset gate between sub-node qubits corresponding to the next root node qubit to obtain a phase offset gate sub-circuit until the sub-node qubits are leaf node qubits; applying the two-qubit phase offset gate with a path restriction between leaf node qubits corresponding to parent node qubits in the target qubit set to obtain a leaf phase offset gate sub-circuit and applying the single qubit phase offset gate to the leaf node qubits to obtain a single qubit phase offset sub-circuit; and combining the flip gate sub-circuit, the phase offset gate sub-circuit, the SWAP gate sub-circuit, the leaf phase offset gate sub-circuit, and the single qubit phase offset sub-circuit into a quantum state preparation circuit.

In another aspect, the present disclosure provides a method for generating a quantum state preparation circuit. The method includes:

- acquiring a single qubit flip gate, a single qubit phase offset gate, a two-qubit SWAP gate, and a two-qubit phase offset gate with a path restriction;
- determining a target qubit set with a binary tree restriction and applying the single qubit flip gate to a first target sub-node qubit corresponding to a root node qubit in the target qubit set to obtain a flip gate sub-circuit;
- applying the two-qubit phase offset gate between sub-node qubits corresponding to the root node qubit to obtain a phase offset gate sub-circuit;
- applying the two-qubit SWAP gate between the first target sub-node qubit and a second target sub-node qubit to obtain a SWAP gate sub-circuit, the second target sub-node qubit being a sub-node qubit of the first target sub-node qubit;
- taking the sub-node qubits as the root node qubit and returning to perform the step of the applying the two-qubit phase offset gate between sub-node qubits corresponding to the root node qubit to obtain a phase offset gate sub-circuit until the sub-node qubits are leaf node qubits;
- applying the two-qubit phase offset gate with a path restriction between leaf node qubits corresponding to parent node qubits in the target qubit set to obtain a leaf phase offset gate sub-circuit and applying the single qubit phase offset gate to the leaf node qubits to obtain a single qubit phase offset sub-circuit; and
- combining the flip gate sub-circuit, the phase offset gate sub-circuit, the SWAP gate sub-circuit, the leaf phase offset gate sub-circuit, and the single qubit phase offset sub-circuit into a quantum state preparation circuit.

In another aspect, the present disclosure further provides an apparatus for generating a quantum state preparation circuit. The apparatus includes:

- a quantum gate acquisition module, configured to acquire a single qubit flip gate, a single qubit phase offset gate, a two-qubit SWAP gate, and a two-qubit phase offset gate with a path restriction;
- a flip gate action module, configured to determine a target qubit set with a binary tree restriction and apply the single qubit flip gate to a first target sub-node qubit corresponding to a root node qubit in the target qubit set to obtain a flip gate sub-circuit;
- a phase offset gate action module, configured to apply the two-qubit phase offset gate between sub-node qubits corresponding to the root node qubit to obtain a phase offset gate sub-circuit;
- a SWAP gate action module, configured to apply the two-qubit SWAP gate between the first target sub-node qubit and a second target sub-node qubit to obtain a SWAP gate sub-circuit, the second target sub-node qubit being a sub-node qubit of the first target sub-node qubit;
- an iteration module, configured to take the sub-node qubits as the root node qubit and return to perform the step of the applying the two-qubit phase offset gate between the sub-node qubits corresponding to the root node qubit to obtain the phase offset gate sub-circuit until the sub-node qubits are leaf node qubits;
- a leaf node action module, configured to apply the two-qubit phase offset gate with a path restriction between leaf node qubits corresponding to parent node qubits in the target qubit set to obtain a leaf phase offset gate sub-circuit and apply the single qubit phase offset gate to the leaf node qubits to obtain a single qubit phase offset sub-circuit; and
- a combination module, configured to combine the flip gate sub-circuit, the phase offset gate sub-circuit, the SWAP gate sub-circuit, the leaf phase offset gate sub-circuit, and the single qubit phase offset sub-circuit into a quantum state preparation circuit.

In another aspect, the present disclosure further provides a quantum chip, including a quantum state preparation circuit, the quantum state preparation circuit being implemented by the method for generating a quantum state preparation circuit, and the method for generating a quantum state preparation circuit including:

- acquiring a single qubit flip gate, a single qubit phase offset gate, a two-qubit SWAP gate, and a two-qubit phase offset gate with a path restriction;
- determining a target qubit set with a binary tree restriction and applying the single qubit flip gate to a first target sub-node qubit corresponding to a root node qubit in the target qubit set to obtain a flip gate sub-circuit;
- applying the two-qubit phase offset gate between sub-node qubits corresponding to the root node qubit to obtain a phase offset gate sub-circuit;
- applying the two-qubit SWAP gate between the first target sub-node qubit and a second target sub-node qubit to obtain a SWAP gate sub-circuit, the second target sub-node qubit being a sub-node qubit of the first target sub-node qubit;
- taking the sub-node qubits as the root node qubit and returning to perform the step of the applying the two-qubit phase offset gate between sub-node qubits corresponding to the root node qubit to obtain a phase offset gate sub-circuit until the sub-node qubits are leaf node qubits;
- applying the two-qubit phase offset gate with a path restriction between leaf node qubits corresponding to parent node qubits in the target qubit set to obtain a leaf phase offset gate sub-circuit and applying the single qubit phase offset gate to the leaf node qubits to obtain a single qubit phase offset sub-circuit; and
- combining the flip gate sub-circuit, the phase offset gate sub-circuit, the SWAP gate sub-circuit, the leaf phase offset gate sub-circuit, and the single qubit phase offset sub-circuit into a quantum state preparation circuit.

In another aspect, the present disclosure further provides an electronic device. The electronic device includes a memory and a processor, the memory storing a computer-readable instruction which, when executed by the processor, performs the following steps:

- acquiring a single qubit flip gate, a single qubit phase offset gate, a two-qubit SWAP gate, and a two-qubit phase offset gate with a path restriction;

determining a target qubit set with a binary tree restriction and applying the single qubit flip gate to a first target sub-node qubit corresponding to a root node qubit in the target qubit set to obtain a flip gate sub-circuit;

applying the two-qubit phase offset gate between sub-node qubits corresponding to the root node qubit to obtain a phase offset gate sub-circuit;

applying the two-qubit SWAP gate between the first target sub-node qubit and a second target sub-node qubit to obtain a SWAP gate sub-circuit, the second target sub-node qubit being a sub-node qubit of the first target sub-node qubit;

taking the sub-node qubits as the root node qubit and returning to perform the step of the applying the two-qubit phase offset gate between sub-node qubits corresponding to the root node qubit to obtain a phase offset gate sub-circuit until the sub-node qubits are leaf node qubits;

applying the two-qubit phase offset gate with a path restriction between leaf node qubits corresponding to parent node qubits in the target qubit set to obtain a leaf phase offset gate sub-circuit and applying the single qubit phase offset gate to the leaf node qubits to obtain a single qubit phase offset sub-circuit; and combining the flip gate sub-circuit, the phase offset gate sub-circuit, the SWAP gate sub-circuit, the leaf phase offset gate sub-circuit, and the single qubit phase offset sub-circuit into a quantum state preparation circuit.

In another aspect, the present disclosure further provides a computer-readable storage medium. The computer-readable storage medium has stored thereon a computer-readable instruction which, when executed by a processor, performs the following steps:

acquiring a single qubit flip gate, a single qubit phase offset gate, a two-qubit SWAP gate, and a two-qubit phase offset gate with a path restriction;

determining a target qubit set with a binary tree restriction and applying the single qubit flip gate to a first target sub-node qubit corresponding to a root node qubit in the target qubit set to obtain a flip gate sub-circuit;

applying the two-qubit phase offset gate between sub-node qubits corresponding to the root node qubit to obtain a phase offset gate sub-circuit;

applying the two-qubit SWAP gate between the first target sub-node qubit and a second target sub-node qubit to obtain a SWAP gate sub-circuit, the second target sub-node qubit being a sub-node qubit of the first target sub-node qubit;

taking the sub-node qubits as the root node qubit and returning to perform the step of the applying the two-qubit phase offset gate between sub-node qubits corresponding to the root node qubit to obtain a phase offset gate sub-circuit until the sub-node qubits are leaf node qubits;

applying the two-qubit phase offset gate with a path restriction between leaf node qubits corresponding to parent node qubits in the target qubit set to obtain a leaf phase offset gate sub-circuit and applying the single qubit phase offset gate to the leaf node qubits to obtain a single qubit phase offset sub-circuit; and combining the flip gate sub-circuit, the phase offset gate sub-circuit, the SWAP gate sub-circuit, the leaf phase offset gate sub-circuit, and the single qubit phase offset sub-circuit into a quantum state preparation circuit.

In another aspect, the present disclosure further provides a computer program product. The computer program product includes a computer-readable instruction which, when executed by a processor, performs the following steps:

acquiring a single qubit flip gate, a single qubit phase offset gate, a two-qubit SWAP gate, and a two-qubit phase offset gate with a path restriction;

determining a target qubit set with a binary tree restriction and applying the single qubit flip gate to a first target sub-node qubit corresponding to a root node qubit in the target qubit set to obtain a flip gate sub-circuit;

applying the two-qubit phase offset gate between sub-node qubits corresponding to the root node qubit to obtain a phase offset gate sub-circuit;

applying the two-qubit SWAP gate between the first target sub-node qubit and a second target sub-node qubit to obtain a SWAP gate sub-circuit, the second target sub-node qubit being a sub-node qubit of the first target sub-node qubit;

taking the sub-node qubits as the root node qubit and returning to perform the step of the applying the two-qubit phase offset gate between sub-node qubits corresponding to the root node qubit to obtain a phase offset gate sub-circuit until the sub-node qubits are leaf node qubits;

applying the two-qubit phase offset gate with a path restriction between leaf node qubits corresponding to parent node qubits in the target qubit set to obtain a leaf phase offset gate sub-circuit and applying the single qubit phase offset gate to the leaf node qubits to obtain a single qubit phase offset sub-circuit; and combining the flip gate sub-circuit, the phase offset gate sub-circuit, the SWAP gate sub-circuit, the leaf phase offset gate sub-circuit, and the single qubit phase offset sub-circuit into a quantum state preparation circuit.

In the method and apparatus for generating a quantum state preparation circuit, a quantum chip, an electronic device, a storage medium, and a computer program product described above, by determining a target qubit set with a binary tree restriction and applying the single qubit flip gate to a first target sub-node qubit corresponding to a root node qubit in the target qubit set, a flip gate sub-circuit is obtained; by applying the two-qubit phase offset gate between sub-node qubits corresponding to the root node qubit, a phase offset gate sub-circuit is obtained; by applying the two-qubit SWAP gate between the first target sub-node qubit and a second target sub-node qubit, a SWAP gate sub-circuit is obtained, the second target sub-node qubit being a sub-node qubit of the first target sub-node qubit; by taking the sub-node qubits as the root node qubit and returning to perform the step of the applying the two-qubit phase offset gate between sub-node qubits corresponding to the root node qubit, a phase offset gate sub-circuit is obtained until the sub-node qubits are leaf node qubits; by applying the two-qubit phase offset gate with a path restriction between leaf node qubits corresponding to parent node qubits in the target qubit set, a leaf phase offset gate sub-circuit is obtained, and by applying the single qubit phase offset gate to the leaf node qubits, a single qubit phase offset sub-circuit is obtained; and the flip gate sub-circuit, the phase offset gate sub-circuit, the SWAP gate sub-circuit, the leaf phase offset gate sub-circuit, and the single qubit phase offset sub-circuit are combined into a quantum state preparation circuit. Therefore, circuit depth of the quantum state preparation circuit can be effectively reduced, so that the quantum state preparation time can be effectively reduced, and the operation efficiency of quantum computation can be improved.

In an aspect, the present disclosure provides a method for preparing a quantum state. The method includes:

acquiring a target data vector and acquiring a target single qubit flip gate, a target single qubit phase offset gate, a target two-qubit SWAP gate, and a target two-qubit phase offset gate with a path restriction based on the target data vector;

determining a target qubit set with a binary tree restriction and applying the target single qubit flip gate to a first target sub-node qubit corresponding to a root node qubit in the target qubit set to obtain a target flip gate sub-circuit;

applying the target two-qubit phase offset gate between sub-node qubits corresponding to the root node qubit to obtain a target phase offset gate sub-circuit;

applying the target two-qubit SWAP gate between the first target sub-node qubit and a second target sub-node qubit to obtain a target SWAP gate sub-circuit, the second target sub-node qubit being a sub-node qubit of the first target sub-node qubit;

taking the sub-node qubits as the root node qubit and returning to perform the step of the applying the target two-qubit phase offset gate between the sub-node qubits corresponding to the root node qubit to obtain the target phase offset gate sub-circuit until the sub-node qubits are leaf node qubits;

applying the target two-qubit phase offset gate with a path restriction between leaf node qubits corresponding to parent node qubits in the target qubit set to obtain a target leaf phase offset gate sub-circuit and applying the target single qubit phase offset gate to the leaf node qubits to obtain a target single qubit phase offset sub-circuit;

combining the target flip gate sub-circuit, the target phase offset gate sub-circuit, the target SWAP gate sub-circuit, the target leaf phase offset gate sub-circuit, and the target single qubit phase offset sub-circuit into a target quantum state preparation circuit corresponding to the target data vector; and inputting a preset initial quantum state to the target quantum state preparation circuit to prepare a quantum state and obtain a quantum state corresponding to the target data vector.

In another aspect, the present disclosure further provides an apparatus for preparing a quantum state. The apparatus includes:

a target quantum gate acquisition module, configured to acquire a target data vector and acquire a target single qubit flip gate, a target single qubit phase offset gate, a target two-qubit SWAP gate, and a target two-qubit phase offset gate with a path restriction based on the target data vector;

a target flip gate action module, configured to determine a target qubit set with a binary tree restriction and apply the target single qubit flip gate to a first target sub-node qubit corresponding to a root node qubit in the target qubit set to obtain a target flip gate sub-circuit;

a target phase offset gate action module, configured to apply the target two-qubit phase offset gate between sub-node qubits corresponding to the root node qubit to obtain a target phase offset gate sub-circuit;

a target SWAP gate action module, configured to apply the target two-qubit SWAP gate between the first target sub-node qubit and a second target sub-node qubit to obtain a target SWAP gate sub-circuit, the second target sub-node qubit being a sub-node qubit of the first target sub-node qubit;

a target iteration module, configured to take the sub-node qubits as the root node qubit and return to perform the step of the applying the target two-qubit phase offset gate between the sub-node qubits corresponding to the root node qubit to obtain the target phase offset gate sub-circuit until the sub-node qubits are leaf node qubits;

a target leaf node action module, configured to apply the target two-qubit phase offset gate with a path restriction between leaf node qubits corresponding to parent node qubits in the target qubit set to obtain a target leaf phase offset gate sub-circuit and apply the target single qubit phase offset gate to the leaf node qubits to obtain a target single qubit phase offset sub-circuit;

a target combination module, configured to combine the target flip gate sub-circuit, the target phase offset gate sub-circuit, the target SWAP gate sub-circuit, the target leaf phase offset gate sub-circuit, and the target single qubit phase offset sub-circuit into a target quantum state preparation circuit corresponding to the target data vector; and a preparation module, configured to input a preset initial quantum state to the target quantum state preparation circuit to prepare a quantum state and obtain a quantum state corresponding to the target data vector.

In another aspect, the present disclosure further provides a quantum chip, including a quantum state preparation circuit, the quantum state preparation circuit being implemented by the method for generating a quantum state preparation circuit, and the method for generating a quantum state preparation circuit including:

acquiring a target data vector and acquiring a target single qubit flip gate, a target single qubit phase offset gate, a target two-qubit SWAP gate, and a target two-qubit phase offset gate with a path restriction based on the target data vector;

determining a target qubit set with a binary tree restriction and applying the target single qubit flip gate to a first target sub-node qubit corresponding to a root node qubit in the target qubit set to obtain a target flip gate sub-circuit;

applying the target two-qubit phase offset gate between sub-node qubits corresponding to the root node qubit to obtain a target phase offset gate sub-circuit;

applying the target two-qubit SWAP gate between the first target sub-node qubit and a second target sub-node qubit to obtain a target SWAP gate sub-circuit, the second target sub-node qubit being a sub-node qubit of the first target sub-node qubit;

taking the sub-node qubits as the root node qubit and returning to perform the step of the applying the target two-qubit phase offset gate between the sub-node qubits corresponding to the root node qubit to obtain the target phase offset gate sub-circuit until the sub-node qubits are leaf node qubits;

applying the target two-qubit phase offset gate with a path restriction between leaf node qubits corresponding to parent node qubits in the target qubit set to obtain a target leaf phase offset gate sub-circuit and applying the target single qubit phase offset gate to the leaf node qubits to obtain a target single qubit phase offset sub-circuit;

combining the target flip gate sub-circuit, the target phase offset gate sub-circuit, the target SWAP gate sub-circuit, the target leaf phase offset gate sub-circuit, and the target single qubit phase offset sub-circuit into a target quantum state preparation circuit corresponding to the target data vector; and inputting a preset initial quantum state to the target quantum state preparation circuit to prepare a quantum state and obtain a quantum state corresponding to the target data vector.

In another aspect, the present disclosure further provides an electronic device. The electronic device includes a memory and a processor, the memory storing a computer-readable instruction which, when executed by the processor, performs the following steps:

acquiring a target data vector and acquiring a target single qubit flip gate, a target single qubit phase offset gate, a target two-qubit SWAP gate, and a target two-qubit phase offset gate with a path restriction based on the target data vector;

determining a target qubit set with a binary tree restriction and applying the target single qubit flip gate to a first target sub-node qubit corresponding to a root node qubit in the target qubit set to obtain a target flip gate sub-circuit;

applying the target two-qubit phase offset gate between sub-node qubits corresponding to the root node qubit to obtain a target phase offset gate sub-circuit;

applying the target two-qubit SWAP gate between the first target sub-node qubit and a second target sub-node qubit to obtain a target SWAP gate sub-circuit, the second target sub-node qubit being a sub-node qubit of the first target sub-node qubit;

taking the sub-node qubits as the root node qubit and returning to perform the step of the applying the target two-qubit phase offset gate between the sub-node qubits corresponding to the root node qubit to obtain the target phase offset gate sub-circuit until the sub-node qubits are leaf node qubits;

applying the target two-qubit phase offset gate with a path restriction between leaf node qubits corresponding to parent node qubits in the target qubit set to obtain a target leaf phase offset gate sub-circuit and applying the target single qubit phase offset gate to the leaf node qubits to obtain a target single qubit phase offset sub-circuit;

combining the target flip gate sub-circuit, the target phase offset gate sub-circuit, the target SWAP gate sub-circuit, the target leaf phase offset gate sub-circuit, and the target single qubit phase offset sub-circuit into a target quantum state preparation circuit corresponding to the target data vector; and inputting a preset initial quantum state to the target quantum state preparation circuit to prepare a quantum state and obtain a quantum state corresponding to the target data vector.

In another aspect, the present disclosure further provides a computer-readable storage medium. The computer-readable storage medium has stored thereon a computer-readable instruction which, when executed by a processor, performs the following steps:

acquiring a target data vector and acquiring a target single qubit flip gate, a target single qubit phase offset gate, a target two-qubit SWAP gate, and a target two-qubit phase offset gate with a path restriction based on the target data vector;

determining a target qubit set with a binary tree restriction and applying the target single qubit flip gate to a first target sub-node qubit corresponding to a root node qubit in the target qubit set to obtain a target flip gate sub-circuit;

applying the target two-qubit phase offset gate between sub-node qubits corresponding to the root node qubit to obtain a target phase offset gate sub-circuit;

applying the target two-qubit SWAP gate between the first target sub-node qubit and a second target sub-node qubit to obtain a target SWAP gate sub-circuit, the second target sub-node qubit being a sub-node qubit of the first target sub-node qubit;

taking the sub-node qubits as the root node qubit and returning to perform the step of the applying the target two-qubit phase offset gate between the sub-node qubits corresponding to the root node qubit to obtain the target phase offset gate sub-circuit until the sub-node qubits are leaf node qubits;

applying the target two-qubit phase offset gate with a path restriction between leaf node qubits corresponding to parent node qubits in the target qubit set to obtain a target leaf phase offset gate sub-circuit and applying the target single qubit phase offset gate to the leaf node qubits to obtain a target single qubit phase offset sub-circuit;

combining the target flip gate sub-circuit, the target phase offset gate sub-circuit, the target SWAP gate sub-circuit, the target leaf phase offset gate sub-circuit, and the target single qubit phase offset sub-circuit into a target quantum state preparation circuit corresponding to the target data vector; and inputting a preset initial quantum state to the target quantum state preparation circuit to prepare a quantum state and obtain a quantum state corresponding to the target data vector.

In another aspect, the present disclosure further provides a computer program product. The computer program product includes a computer-readable instruction which, when executed by a processor, performs the following steps:

acquiring a target data vector and acquiring a target single qubit flip gate, a target single qubit phase offset gate, a target two-qubit SWAP gate, and a target two-qubit phase offset gate with a path restriction based on the target data vector;

determining a target qubit set with a binary tree restriction and applying the target single qubit flip gate to a first target sub-node qubit corresponding to a root node qubit in the target qubit set to obtain a target flip gate sub-circuit;

applying the target two-qubit phase offset gate between sub-node qubits corresponding to the root node qubit to obtain a target phase offset gate sub-circuit;

applying the target two-qubit SWAP gate between the first target sub-node qubit and a second target sub-node qubit to obtain a target SWAP gate sub-circuit, the second target sub-node qubit being a sub-node qubit of the first target sub-node qubit;

taking the sub-node qubits as the root node qubit and returning to perform the step of the applying the target two-qubit phase offset gate between the sub-node qubits corresponding to the root node qubit to obtain the target phase offset gate sub-circuit until the sub-node qubits are leaf node qubits;

applying the target two-qubit phase offset gate with a path restriction between leaf node qubits corresponding to parent node qubits in the target qubit set to obtain a target leaf phase offset gate sub-circuit and applying the target single qubit phase offset gate to the leaf node qubits to obtain a target single qubit phase offset sub-circuit;

combining the target flip gate sub-circuit, the target phase offset gate sub-circuit, the target SWAP gate sub-circuit, the target leaf phase offset gate sub-circuit, and the target single qubit phase offset sub-circuit into a target quantum state preparation circuit corresponding to the target data vector; and inputting a preset initial quantum state to the target quantum state preparation circuit to prepare a quantum state and obtain a quantum state corresponding to the target data vector.

In the method and apparatus for preparing a quantum state, a quantum chip, an electronic device, a storage medium, and a computer program product described above, by acquiring a target single qubit flip gate, a target single qubit phase offset gate, a target two-qubit SWAP gate, and a target two-qubit phase offset gate with a path restriction corresponding to a target data vector, a target quantum state preparation circuit corresponding to the target data vector is generated by a target qubit set with a binary tree restriction and using the target single qubit flip gate, the target single qubit phase offset gate, the target two-qubit SWAP gate, and the target two-qubit phase offset gate with a path restriction. Circuit depths of the target single qubit flip gate, the target single qubit phase offset gate, the target two-qubit SWAP gate, and the target two-qubit phase offset gate with a path restriction are applied to the target qubit with a binary tree restriction. The path restrictions in the binary tree restriction are not intersected, so that the circuit depth of the obtained quantum state preparation circuit can be significantly reduced, thus effectively reducing the circuit depth of the quantum state preparation circuit. Then, by inputting a preset initial quantum state to the target quantum state preparation circuit to prepare a quantum state, a quantum state corresponding to the target data vector is obtained. That is to say, using the target quantum state preparation circuit with a reduced circuit depth to prepare a quantum state, the time of preparing a quantum state can be effectively reduced, and the operation efficiency of quantum computation can be increased, thus improving the efficiency of preparing a quantum state.

BRIEF DESCRIPTION OF THE DRAWINGS

In order to illustrate the embodiments of the present disclosure or the technical solutions more clearly, the drawings that need to be used in the description of the embodiments will be briefly described below. It is apparent that the drawings in the following description are only some embodiments of the present disclosure, and other drawings can be obtained by those skilled in the art according to the drawings without creative work.

according to an embodiment.

Figure 5:
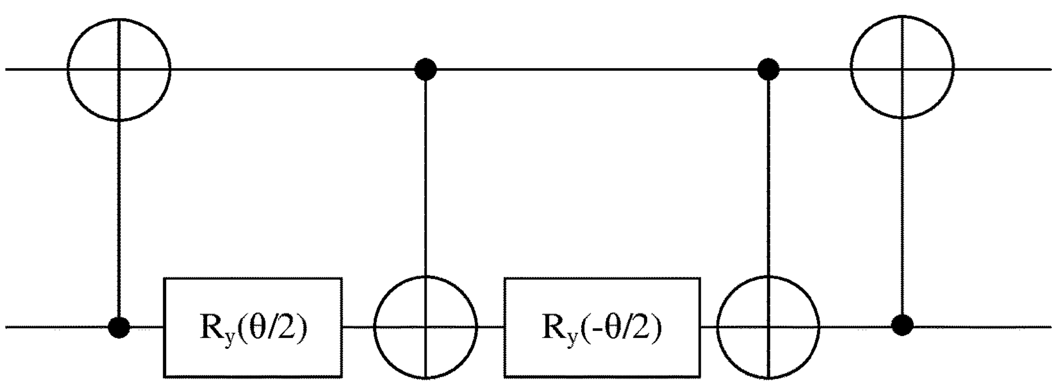

FIG. 5 is a schematic illustration of a circuit implementation of a two-qubit rotating gate $$R_y^{i,j}(\theta)$$

according to an embodiment.

Figure 6:
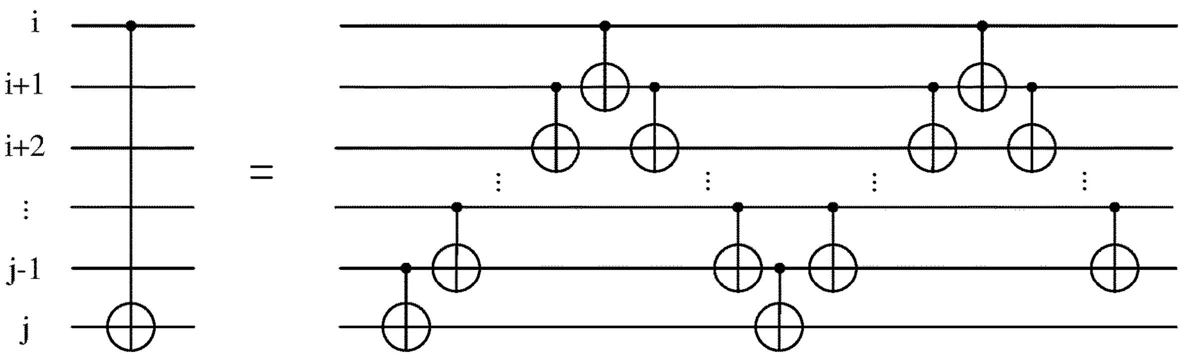

FIG. 6 is a schematic illustration of a circuit implementation of a CNOT gate $$CNOT_j^i$$

with a path restriction according to an embodiment.

Figure 7:
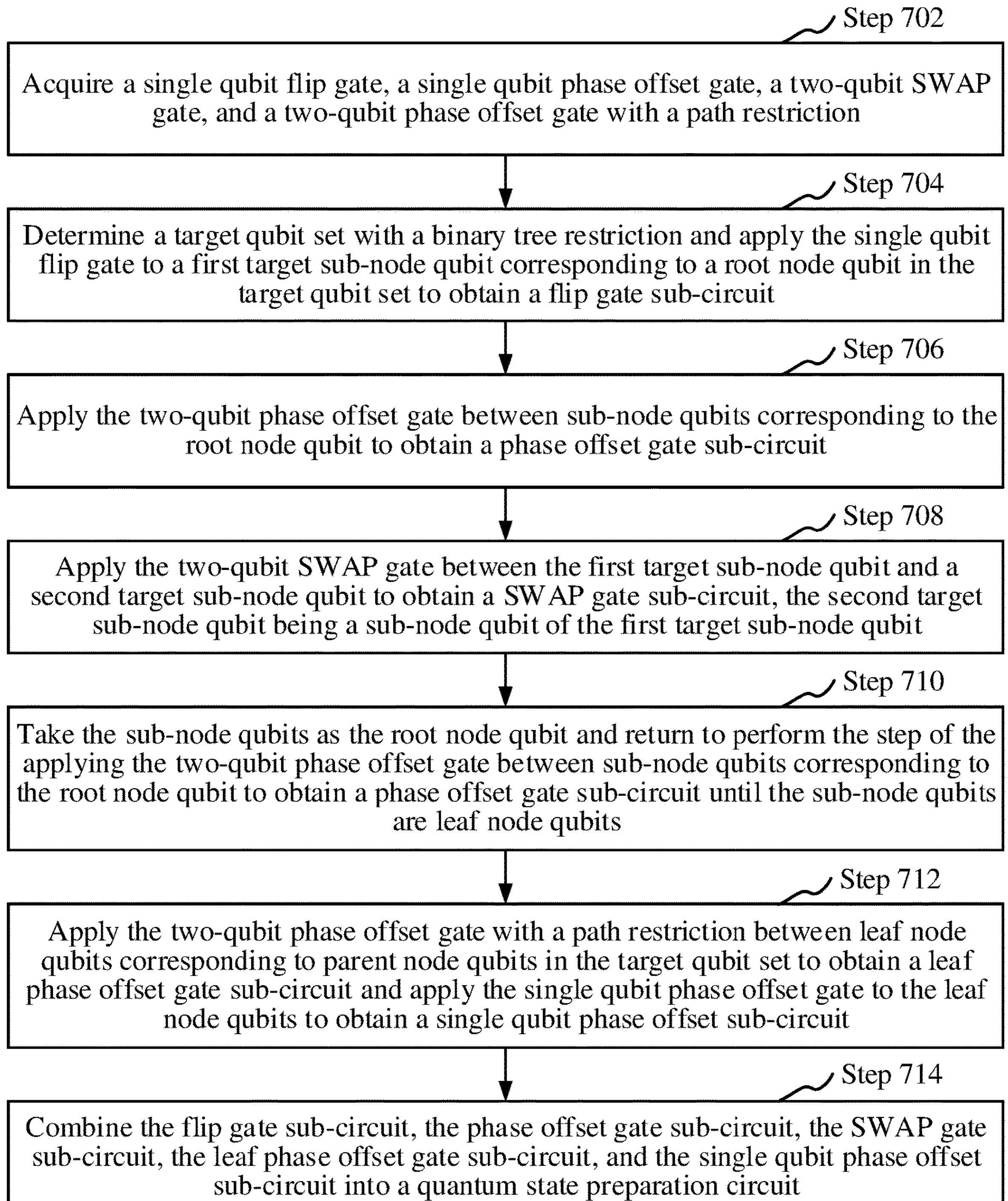

FIG. 7 is a flowchart of a method for generating a quantum state preparation circuit according to an embodiment.

Figure 8:
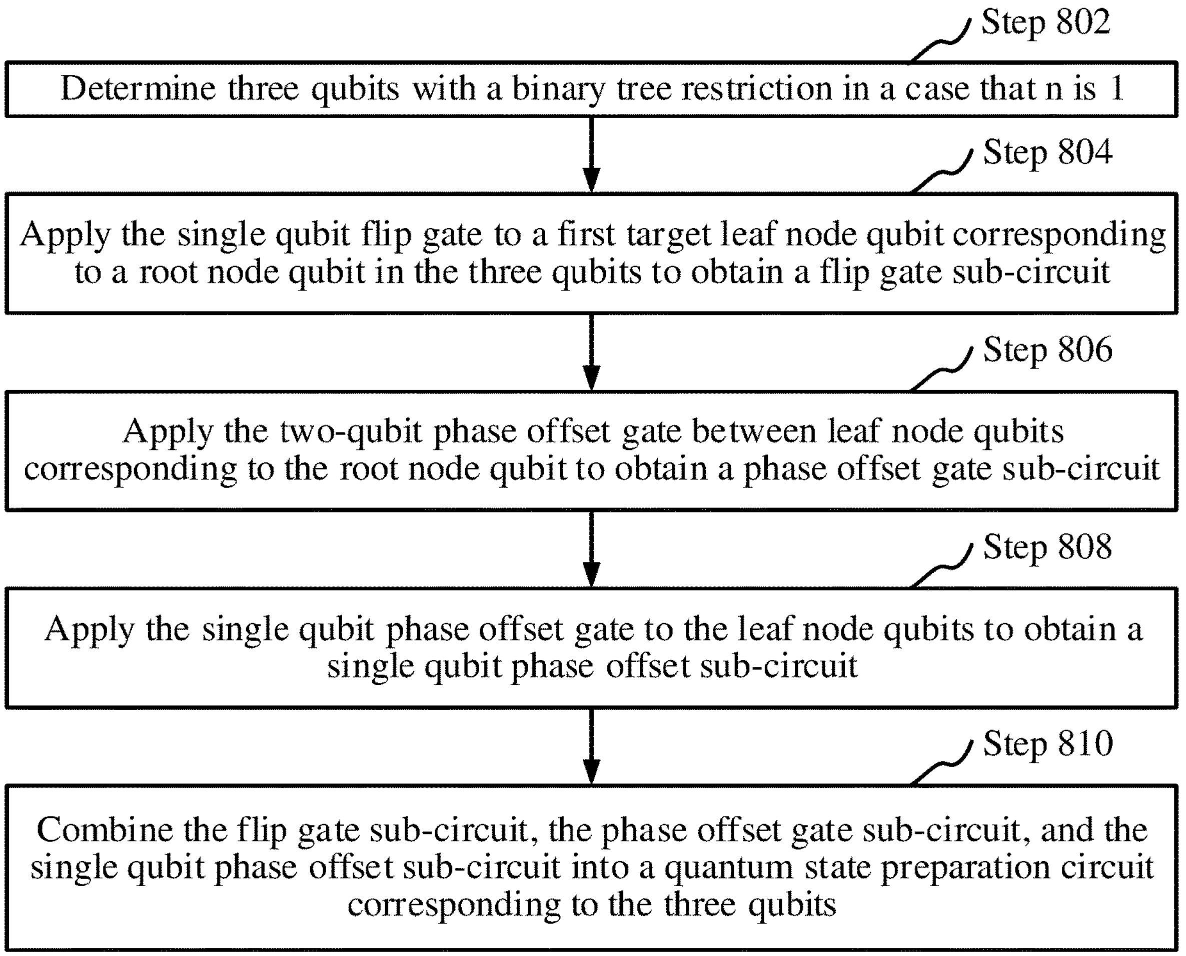

FIG. 8 is a flowchart of a quantum state preparation circuit for generating three qubits according to an embodiment.

Figure 9:
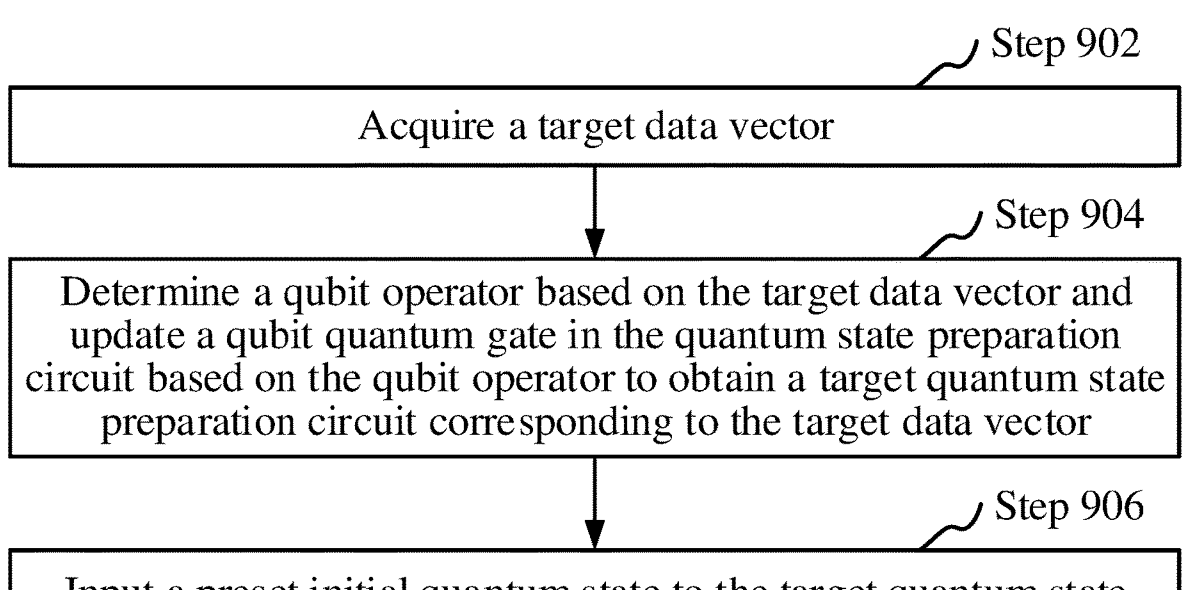

FIG. 9 is a flowchart of obtaining a quantum state corresponding to a target data vector according to an embodiment.

Figure 10:
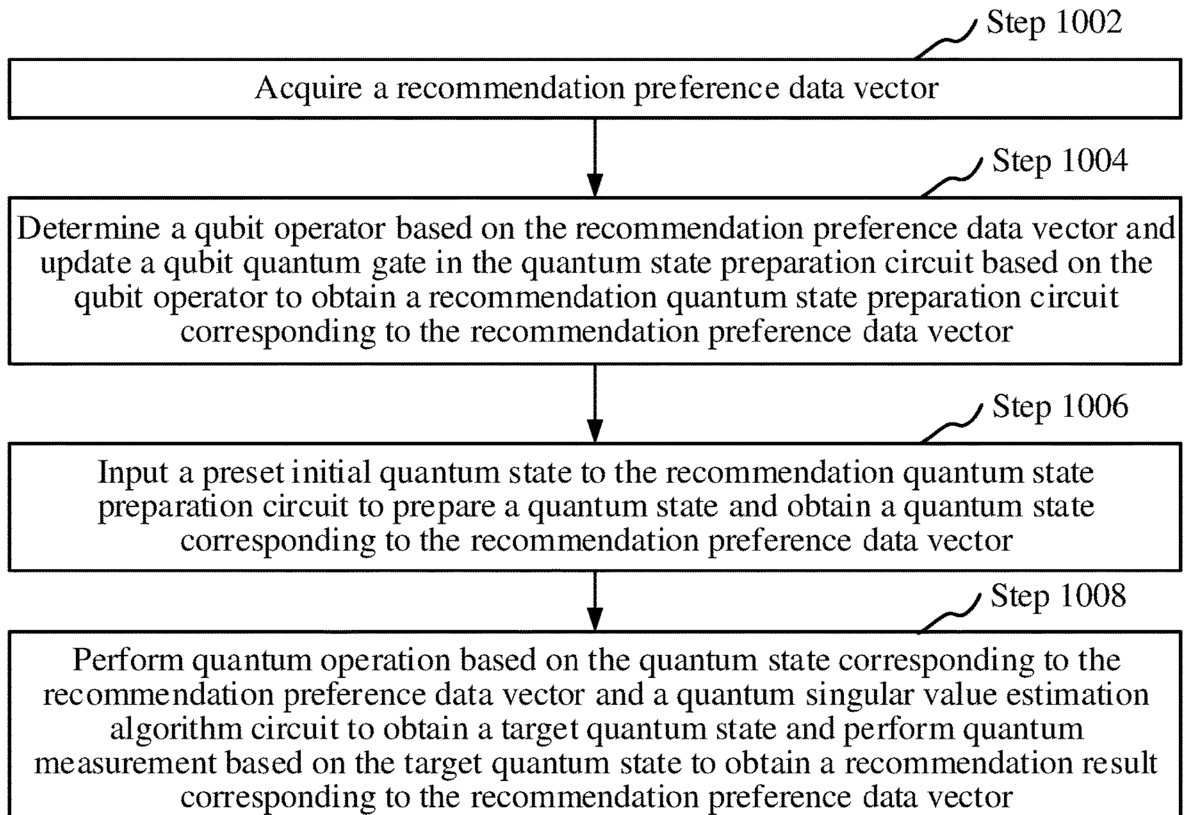

FIG. 10 is a flowchart of a quantum recommendation according to an embodiment.

Figure 11:
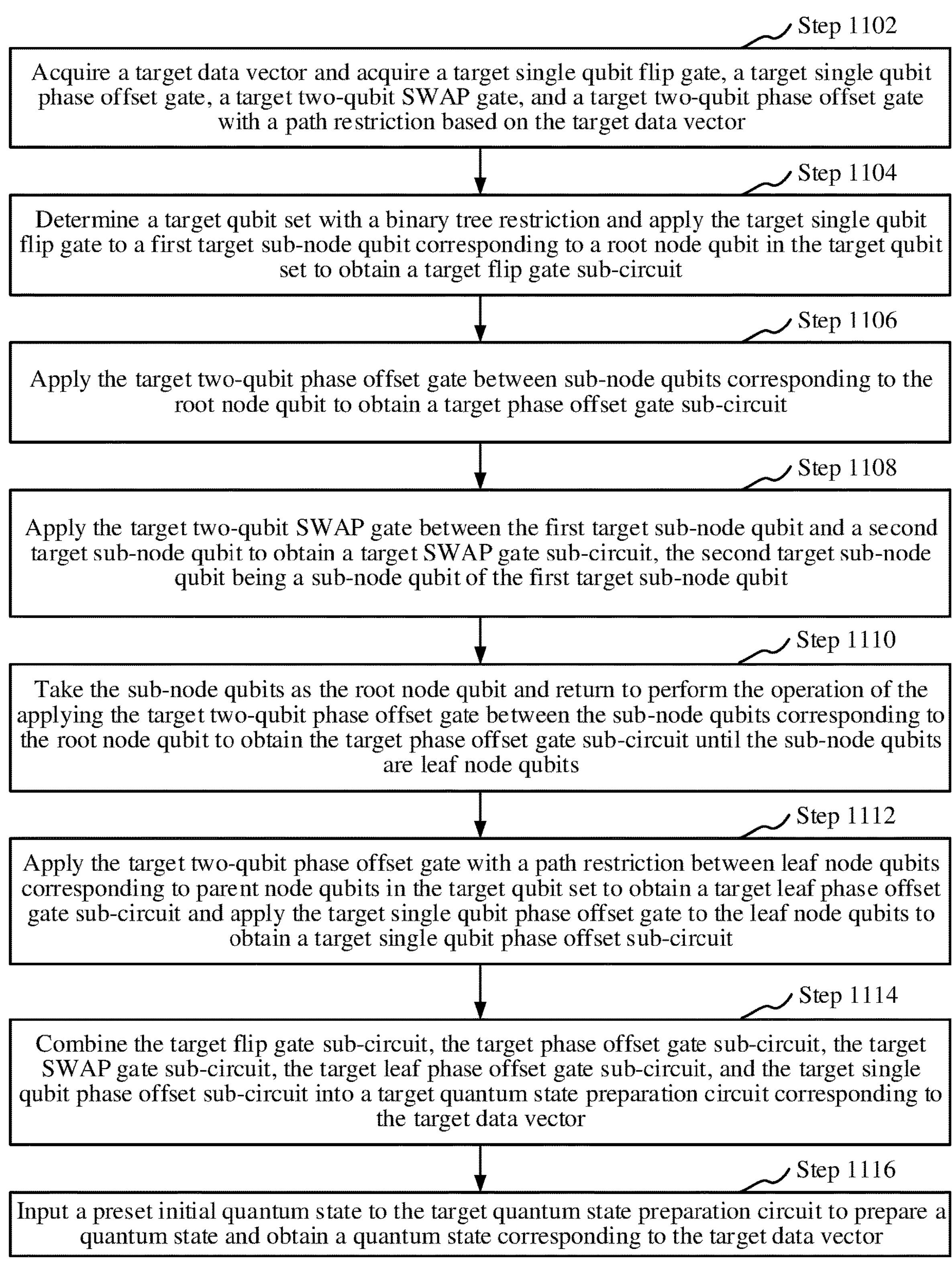

FIG. 11 is a flowchart of a method for preparing a quantum state according to an embodiment.

Figure 12:
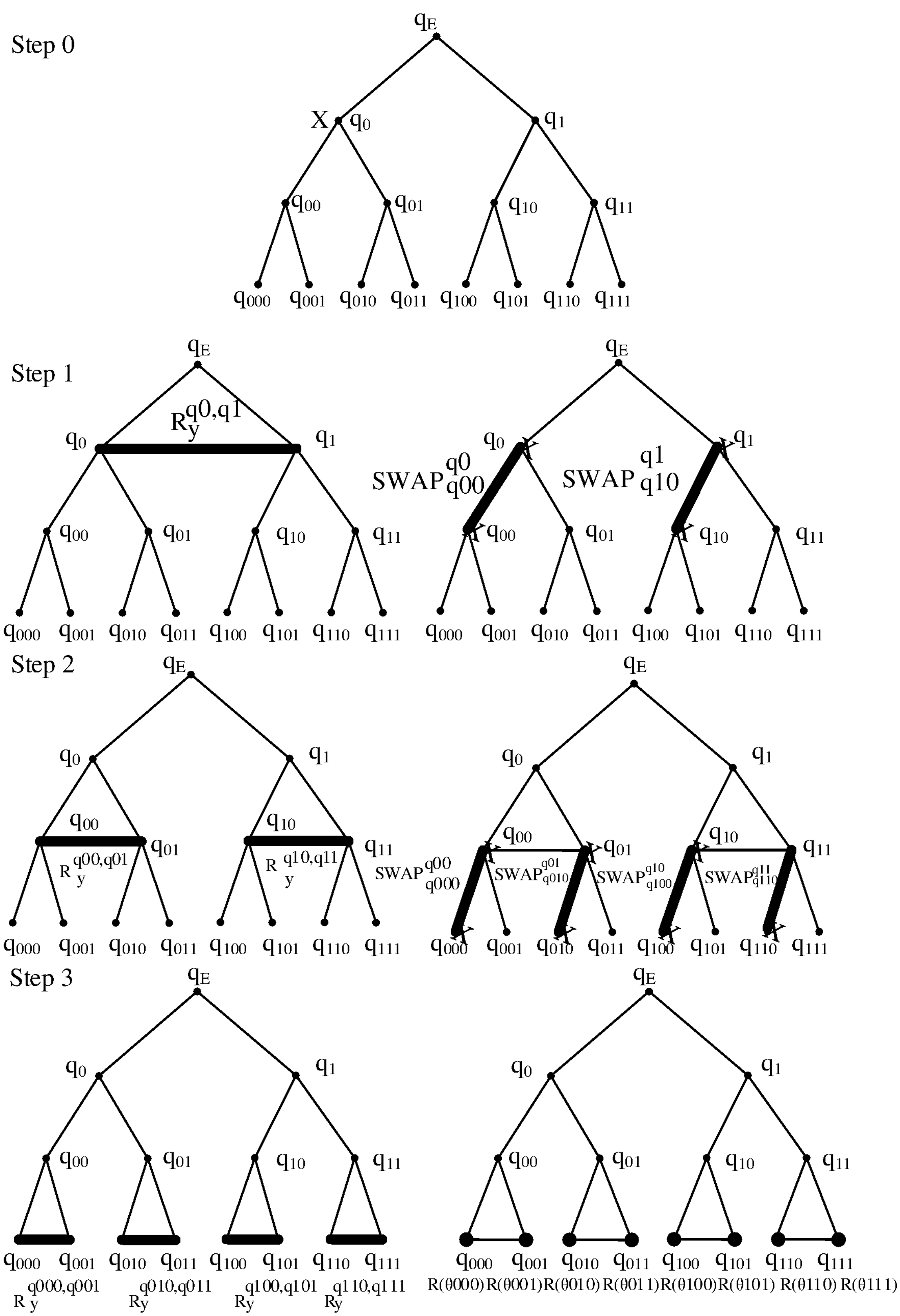

FIG. 12 is a schematic illustration of generating a quantum state preparation circuit according to a particular embodiment.

Figure 13:
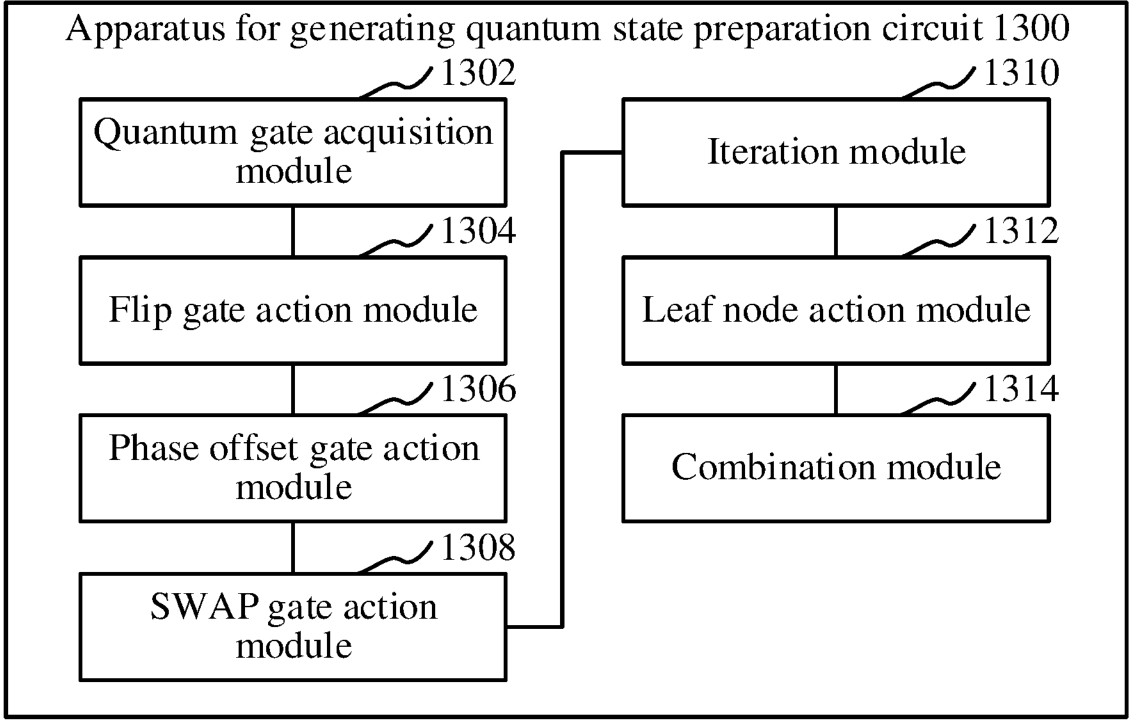

FIG. 13 is a structural block diagram of an apparatus for generating a quantum state preparation circuit according to an embodiment.

Figure 14:
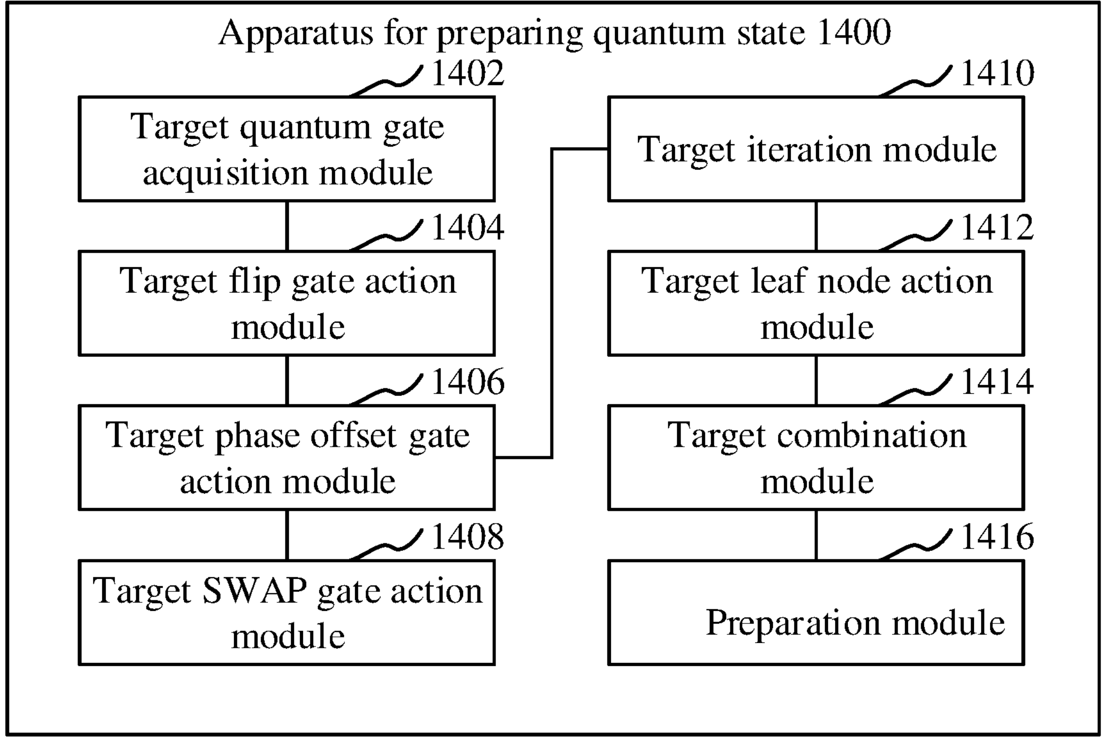

FIG. 14 is a structural block diagram of an apparatus for preparing a quantum state according to an embodiment.

Figure 15:
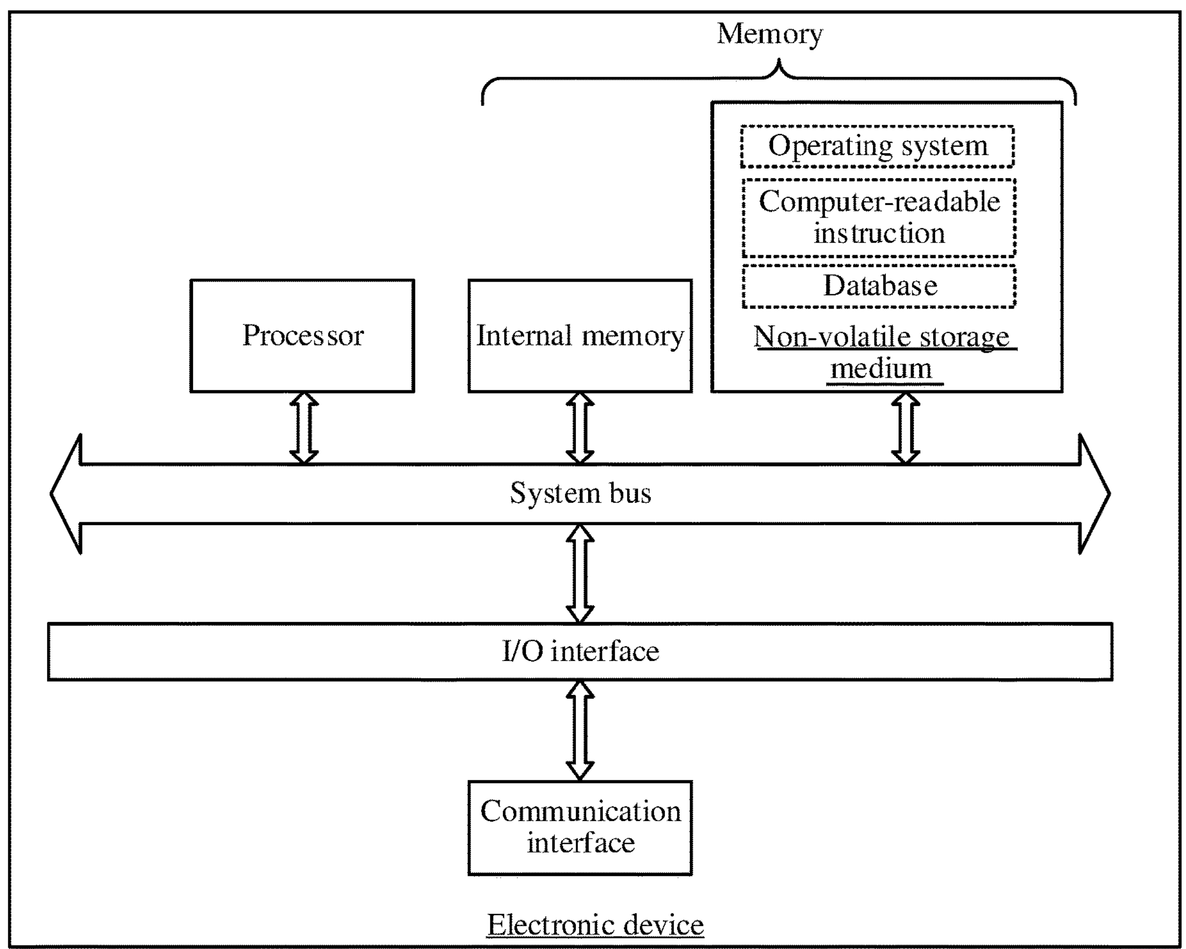

FIG. 15 is a diagram of an internal structure of an electronic device according to an embodiment.

DESCRIPTION OF EMBODIMENTS

To make objects, technical solutions, and advantages of the present disclosure clearer, the following further describes the present disclosure in detail with reference to the drawings and embodiments. It is understood that the particular embodiments described herein are only used to explain the present disclosure and do not limit the present disclosure.

Figure 1:
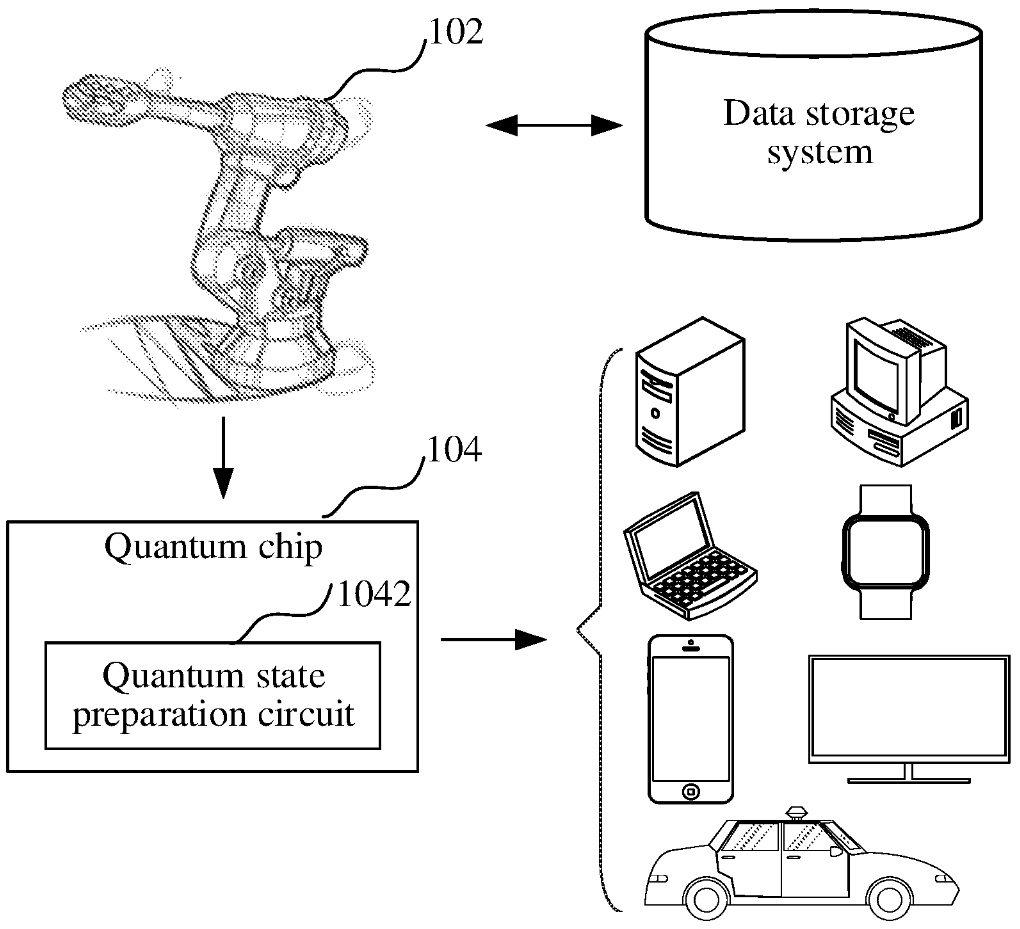
FIG. 1 is a diagram showing an application environment of a method for generating a quantum state preparation circuit according to an embodiment.

A method for generating a quantum state preparation circuit provided in an embodiment of the present disclosure may be applied to an application environment as shown in FIG. 1. An electronic device 102 communicates with a quantum chip 104 via a network. A data storage system may store data that the electronic device 102 needs to process. The data storage system may be integrated on the electronic device 102 or placed on a cloud or other network servers. The electronic device 102 can be used to generate a quantum state preparation circuit 1042. The electronic device 102 acquires a single qubit flip gate, a single qubit phase offset gate, a two-qubit SWAP gate, and a two-qubit phase offset gate with a path restriction; the electronic device 102 determines a target qubit set with a binary tree restriction and applies the single qubit flip gate to a first target sub-node qubit corresponding to a root node qubit in the target qubit set to obtain a flip gate sub-circuit; the electronic device 102 applies the two-qubit phase offset gate between sub-node qubits corresponding to the root node qubit to obtain a phase offset gate sub-circuit; the electronic device 102 applies the two-qubit SWAP gate between the first target sub-node qubit and a second target sub-node qubit to obtain a SWAP gate sub-circuit, the second target sub-node qubit being a sub-node qubit of the first target sub-node qubit; the electronic device 102 takes the sub-node qubits as the root node qubit and returns to perform the step of the applying the two-qubit phase offset gate between sub-node qubits corresponding to the root node qubit to obtain a phase offset gate sub-circuit until the sub-node qubits are leaf node qubits; the electronic device 102 applies the two-qubit phase offset gate with a path restriction between leaf node qubits corresponding to parent node qubits in the target qubit set to obtain a leaf phase offset gate sub-circuit and applies the single qubit phase offset gate to the leaf node qubits to obtain a single qubit phase offset sub-circuit; and the electronic device 102 combines the flip gate sub-circuit, the phase offset gate sub-circuit, the SWAP gate sub-circuit, the leaf phase offset gate sub-circuit, and the single qubit phase offset sub-circuit into the quantum state preparation circuit 1042. Finally, the quantum chip 104 can be fabricated based on the quantum state preparation circuit 1042.

The electronic device 102 may be an industrial intelligent device for fabricating the quantum state preparation circuit 1042, such as a lithographic device, a robot arm, and other devices required for industrial production. After the quantum chip 104 is fabricated using the quantum state preparation circuit 1042, the quantum chip 104 can be integrated on various intelligent terminals, including: a smart phone, a tablet computer, a notebook computer, a desktop computer, a smart speaker, a smart watch, an Internet of Things device, and a portable wearable device. The Internet of Things device may be a smart speaker, a smart television, a smart air conditioner, a smart vehicle-mounted device, and the like. The portable wearable device may be a smart watch, a smart bracelet, a head-mounted device, and the like.

Before the embodiments of the present disclosure are further described in detail, the nouns, terms, symbols, parameters and basic quantum gates involved in the embodiments of the present disclosure are explained. The nouns and terms involved in the embodiments of the present disclosure are explained as follows:

(1) Quantum computation: a computing way to complete the computation task quickly using the properties of a quantum state, such as superposition and entanglement.

(2) Qubit: a form of carrying quantum information.

(3) Quantum circuit: a quantum computation model composed of a series of quantum gate sequences with the computation being completed by the quantum gates.

(4) Quantum chip (superconducting quantum chip): a central processing unit (CPU) of a quantum computer. The quantum computer is a kind of machine which uses the superposition principle of quantum mechanics and quantum entanglement to perform the computation. It has a strong parallel processing ability and can solve some problems which the classic computer fails to compute.

(5) Basic symbols involved in the present disclosure: $[n]_0$ denotes a set $\{0,1, \ldots, n\}$. $\mathbb{F}_2$ denotes a binary field. $\in$ denotes an empty string. For any $x \in \{0,1\}^n$, $e_x$ denotes a vector representing that the element numbered x is 1, and other elements are 0. For any qubit number i, $|\psi\rangle_i$ represents that the quantum state $|\psi\rangle$ is a quantum state on the qubit i.

(6) The basic quantum gates involved in the present disclosure: to better describe the structure of the quantum circuit with a binary tree restriction, the present disclosure first introduces some basic quantum gates.

The single qubit flip gate X is defined as: $|0\rangle \rightarrow |0\rangle$, $|1\rangle \rightarrow e^{i\theta}|1\rangle$.

For any real number $\theta \in \mathbb{R}$ the single qubit gates $R(\theta)$ and $R_y(\theta)$ are defined as:

$$R(\theta): |0\rangle \rightarrow |0\rangle,\ |1\rangle \rightarrow e^{i\theta}|1\rangle,\ R_y(\theta): |0\rangle \rightarrow \cos(\theta/2)|0\rangle + \sin(\theta/2)/1\rangle,\ |1\rangle \rightarrow -\sin(\theta/2)|0\rangle + \cos(\theta/2)|1\rangle.$$

The two-qubit rotating (phase offset) gate $$R_y^{i,j}(\theta)$$

(rotating around the y-axis (phase offset)) applied to the qubits i and j is defined as:

$$|0\rangle_i|0\rangle_j \rightarrow |0\rangle_i|0\rangle_j,$$
$$|1\rangle_i|0\rangle_j \rightarrow \cos(\theta/2)|1\rangle_i|0\rangle_j + \sin(\theta/2)|0\rangle_i|1\rangle_j,$$
$$|0\rangle_i|1\rangle_j \rightarrow -\sin(\theta/2)|1\rangle_i|0\rangle_j + \cos(\theta/2)|0\rangle_i|1\rangle_j,$$
$$|1\rangle_i|1\rangle_j \rightarrow |1\rangle_i|1\rangle_j.$$

The CNOT gate (a controlled NOT gate)

$$CNOT_j^i$$

applied to the qubits i and j is defined as:

$$|0\rangle_i|0\rangle_j \rightarrow |0\rangle_i|0\rangle_j,\ |0\rangle_i|1\rangle_j \rightarrow |0\rangle_i|1\rangle_j,\ |1\rangle_i|0\rangle_j \rightarrow |1\rangle_i|1\rangle_j \rightarrow |1\rangle_i|0\rangle_j$$

The SWAP gate $$\mathrm{SWAP}_j^i$$

applied to the qubits i and j is defined as:

$$|x\rangle_i|y\rangle_j \rightarrow |y\rangle_i|x\rangle_j,\ \forall\, x, y \in \{0, 1\}.$$

Figure 2:
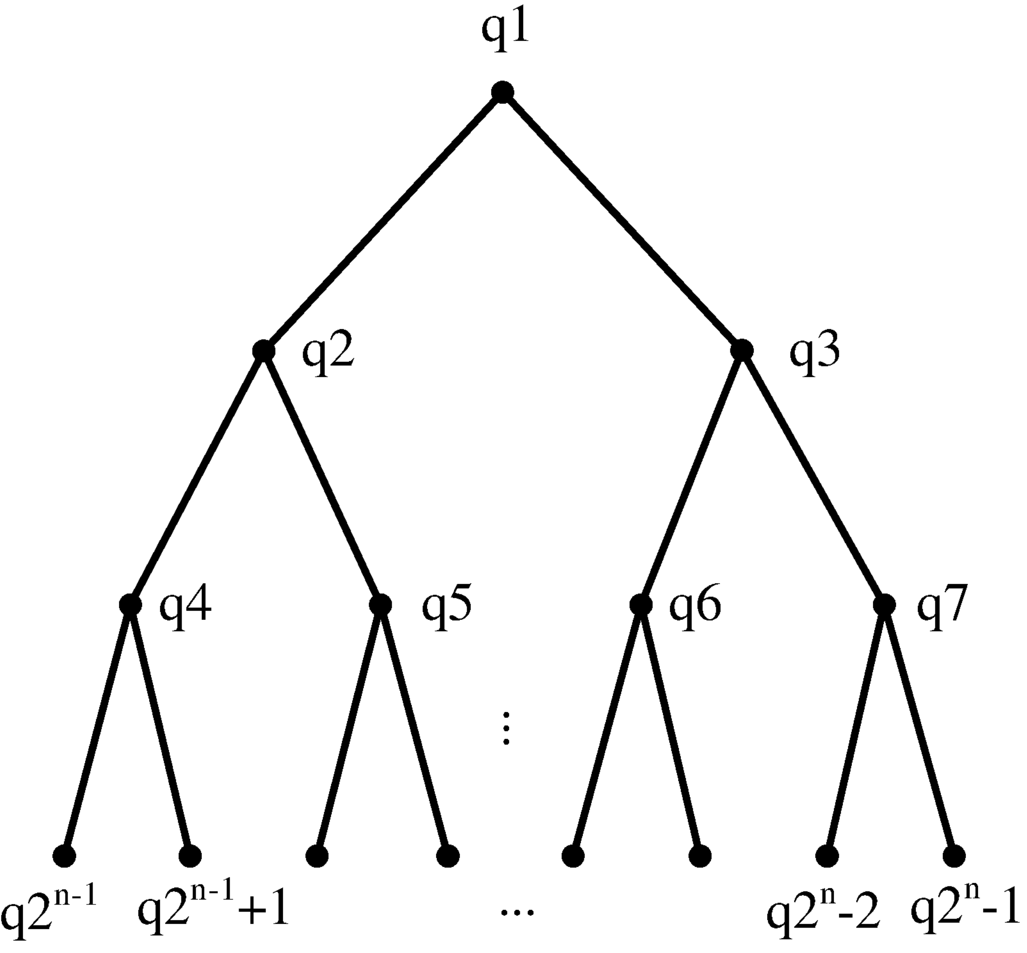
FIG. 2 is a schematic illustration of a binary tree restriction of a quantum circuit according to an embodiment.

(7) Binary tree restriction: if the CNOT gate is only allowed to be applied to two adjacent qubits, then the circuit is in the binary tree restriction. FIG. 2 shows the binary tree restriction of the quantum circuit, and the vertexes $q_1, q_2, \ldots, q_{2^n-1}$ represents $2^n-1$ qubits. If two qubits are connected by an edge in a binary tree, the CNOT gate can be applied to the two qubits.

Figure 3:
FIG. 3 is a schematic illustration of a n path restriction of a n qubit circuit according to an embodiment.

(8) n-path restriction: if the CNOT gate is only allowed to be applied to two adjacent qubits in the n-qubit circuit, then the circuit is in the n-path restriction. FIG. 3 shows the n-path restriction of the n-qubit circuit, and the vertexes $R_1, R_2, \ldots, R_n$ represents n qubits. If two qubits are connected by an edge, the CNOT gate can be applied to the two qubits.

Figure 4:
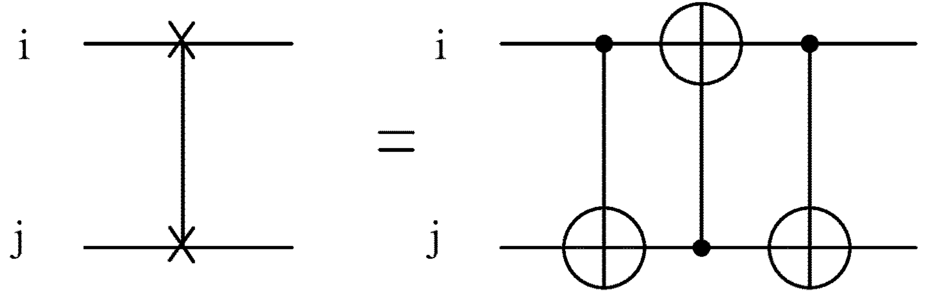
FIG. 4 is a schematic illustration of a circuit implementation of a two-qubit SWAP gate $$SWAP_j^i$$

(9) The present disclosure describes the implementation of four sub-circuits:

1. The circuit implementation of the two-qubit SWAP gate $$\mathrm{SWAP}_j^i$$

is shown in FIG. 4.

2. The circuit implementation of the two-qubit rotating (phase offset) gate $$R_y^{i,j}(\theta)$$

is shown in FIG. 5.

3. The circuit implementation of the CNOT gate $$CNOT_j^i$$

with a path restriction: in a path restriction, $$CNOT_j^i$$

can be implemented by the CNOT circuit with both the depth and the size being O(|i−j|), as shown in FIG. 6.

4. The circuit implementation of the two-qubit rotating gate $$R_y^{i,j}(\theta)$$

with a path restriction: with reference to the circuit implementation of the two-qubit rotating gate $$R_y^{i,j}(\theta)$$

(FIG. 5) and the circuit implementation of the CNOT gate $$CNOT_j^i$$

with a path restriction (FIG. 6), it can be seen that $$R_y^{i,j}(\theta)$$

with a path restriction can be implemented by the quantum circuit with the depth being O(|i−j|).

In an embodiment, as shown in FIG. 7, a method for generating a quantum state preparation circuit is provided. It is illustrated that, for example, the method is applied to the electronic device in FIG. 1, and the method includes the following steps.

Step 702: Acquire a single qubit flip gate, a single qubit phase offset gate, a two-qubit SWAP gate, and a two-qubit phase offset gate with a path restriction.

The single qubit flip gate is a quantum gate for flipping a single qubit. The single qubit phase offset gate is a quantum gate for performing phase offset on a single qubit. The two-qubit SWAP gate is a quantum gate for swapping two-qubits. The two-qubit phase offset gate is a quantum gate for performing phase offset on two-qubits.

Specifically, the electronic device acquires an initial vector and determines the single qubit flip gate, the single qubit phase offset gate, the two-qubit SWAP gate, and the two-qubit phase offset gate with a path restriction based on the initial vector. The initial vector is an initial vector of classic data, which may be preset. The electronic device may also acquire the single qubit flip gate, the single qubit phase offset gate, the two-qubit SWAP gate, and the two-qubit phase offset gate with a path restriction directly from the database. The electronic device may also acquire the single qubit flip gate, the single qubit phase offset gate, the two-qubit SWAP gate, and the two-qubit phase offset gate with a path restriction uploaded by the terminal.

Step 704: Determine a target qubit set with a binary tree restriction and apply the single qubit flip gate to a first target sub-node qubit corresponding to a root node qubit in the target qubit set to obtain a flip gate sub-circuit.

The target qubit set with a binary tree restriction means that the qubits in the target qubit set are arranged in the form of a binary tree, and the CNOT gate only allows a qubit set applied to two adjacent qubits. The binary tree refers to an ordered tree in which the degree of a node is no greater than 2. The binary tree is an empty tree, or a non-empty tree composed of a root node and two mutually disjoint left subtree and right subtree, referred to as the roots. The left subtree and right subtree are also binary trees. The root node qubit refers to a qubit at the root node position in the binary tree. The first target sub-node qubit refers to a qubit at the target sub-node position corresponding to the root node qubit, and the target sub-node position may be a left sub-node position or a right sub-node position. The flip gate sub-circuit is a quantum circuit obtained by applying the single qubit flip gate to the first target sub-node qubit.

Specifically, the electronic device acquires respective qubits and uses the respective qubits to determine the target qubit set with a binary tree restriction. Then the single qubit flip gate is applied to the first target sub-node qubit corresponding to the root node qubit in the target qubit set to obtain the flip gate sub-circuit. Namely, the single qubit flip gate is implemented on the first target sub-node qubit corresponding to the root node qubit in the target qubit set. At this time, a single qubit flip operation may be performed on qubits passing through the first target sub-node, for example, the $|0\rangle$ may be flipped to $|1\rangle$, or the $|1\rangle$ may be flipped to $|0\rangle$.

Step 706: Apply the two-qubit phase offset gate between sub-node qubits corresponding to the root node qubit to obtain a phase offset gate sub-circuit.

Between the sub-node qubits refers to between the qubit in which the left sub-node is located and the qubit in which the right sub-node is located. The phase offset gate sub-circuit refers to a quantum circuit obtained by applying the two-qubit phase offset gate between a qubit in which the left sub-node is located is located and a qubit in which the right sub-node is located of the root node qubit.

Specifically, the electronic device applies the two-qubit phase offset gate with a path restriction between the sub-node qubits corresponding to the root node qubit to obtain the phase offset gate sub-circuit. Namely, the two-qubit phase offset gate is implemented between the qubit in which the left sub-node is located and the qubit in which the right sub-node is located, and then the phase offset operation may be performed on the qubit in which the left sub-node is located and the qubit in which the right sub-node is located.

Step 708: Apply the two-qubit SWAP gate between the first target sub-node qubit and a second target sub-node qubit to obtain a SWAP gate sub-circuit, the second target sub-node qubit being a sub-node qubit of the first target sub-node qubit.

The second target sub-node qubit is a sub-node qubit of the first target sub-node qubit. The second target sub-node qubit refers to a qubit at a corresponding target sub-node position when the first target sub-node qubit serves as a parent node qubit, and the target sub-node position may be a left sub-node position or a right sub-node position. The SWAP gate sub-circuit refers to a quantum circuit obtained by applying the two-qubit SWAP gate between the first target sub-node qubit and the second target sub-node qubit. The parent node qubit refers to a qubit at a parent node position. The parent node position may be a parent node position corresponding to an intermediate node position of a binary tree, and may also be a parent node position corresponding to a leaf node position.

Specifically, the electronic device applies the two-qubit SWAP gate between the first target sub-node qubit and the second target sub-node qubit to obtain the SWAP gate sub-circuit. Namely, the electronic device implements the two-qubit SWAP gate between the first target sub-node qubit and the second target sub-node qubit, and then the qubit SWAP operation may be performed on the first target sub-node qubit and the second target sub-node qubit.

In an embodiment, when the first target sub-node qubit is the qubit at the left sub-node position corresponding to the parent node qubit, the second target sub-node qubit is a qubit at the left sub-node position corresponding to the first target sub-node qubit. When the first target sub-node qubit is the qubit at the right sub-node position corresponding to the parent node qubit, the second target sub-node qubit is a qubit at the right sub-node position corresponding to the first target sub-node qubit. The parent node qubit may be a root node qubit or a non-root node qubit, for example, the parent node qubit may be an intermediate node qubit.

Step 710: Take the sub-node qubits as the root node qubit and return to perform the step of the applying the two-qubit phase offset gate between sub-node qubits corresponding to the root node qubit to obtain a phase offset gate sub-circuit until the sub-node qubits are leaf node qubits.

In some implementations, Step 710 may include iteratively taking a sub-node qubit of the root node qubit as a root node qubit (next-level) and performing the steps of the applying the two-qubit phase offset gate between sub-node qubits corresponding to the root node qubit (next level) to obtain a phase offset gate sub-circuit, until the sub-node qubits corresponding to the root node qubit (next level) are leaf node qubits.

In some implementations, Step 710 may include iteratively taking each sub-node qubit of the root node qubit as a root node qubit (next-level) and performing the steps of the applying the two-qubit phase offset gate between sub-node qubits corresponding to the root node qubit (next level) to obtain a phase offset gate sub-circuit, until the sub-node qubits corresponding to the root node qubit (next level) are leaf node qubits.

The leaf node qubits refer to qubits at leaf node positions in the binary tree.

Specifically, after obtaining the SWAP gate sub-circuit, the electronic device determines whether the sub-node qubits are the leaf node qubits. That is to determine whether the second target sub-node qubit is the leaf node qubit. That is to determine whether the second target sub-node qubit also has the corresponding sub-node qubit. When the second target sub-node qubit does not have the corresponding sub-node qubit, it indicates that the second target sub-node qubit is the leaf node qubit. When the second target sub-node qubit has the corresponding sub-node qubit, it indicates that the second target sub-node qubit is not the leaf node qubit. When the sub-node qubit is not the leaf node qubit, the sub-node qubits is taken as the root node qubit, and it is returned to perform the step of the applying the two-qubit phase offset gate between sub-node qubits corresponding to the root node qubit to obtain a phase offset gate sub-circuit. Namely, the electronic device performs iteration, takes the sub-node qubits as the parent node qubit, and then applies the two-qubit phase offset gate between two sub-node qubits of the parent node qubit to obtain the phase offset gate sub-circuit until the sub-node qubits are the leaf node qubits. When the iteration is completed, the respective phase offset gate sub-circuits and the respective SWAP gate sub-circuits are obtained.

Step 712: Apply the two-qubit phase offset gate with a path restriction between leaf node qubits corresponding to parent node qubits in the target qubit set to obtain a leaf phase offset gate sub-circuit and apply the single qubit phase offset gate to the leaf node qubits to obtain a single qubit phase offset sub-circuit.

The parent node qubit refers to a qubit at the parent node position corresponding to the leaf node position. The leaf phase offset gate sub-circuit refers to a quantum circuit obtained by applying the two-qubit phase offset gate with a path restriction between leaf node qubits corresponding to the parent node qubit. The single qubit phase offset sub-circuit refers to a quantum circuit obtained by applying the single qubit phase offset gate to the leaf node qubits. In some implementations, the parent node qubits relative to the leaf node qubits may only be the direct-parent (i.e., not grand-parent or beyond) node qubits relative to the leaf node qubits.

Specifically, the electronic device determines that the sub-node qubits are the leaf node qubits when the iteration is completed, and then processes the leaf node qubits, i.e., applying the two-qubit phase offset gate with a path restriction between the leaf node qubits corresponding to the parent node qubits in the target qubit set to obtain the leaf phase offset gate sub-circuit. That is to say, the two-qubit phase offset gate with a path restriction is implemented between the leaf node qubits corresponding to the parent node qubit. In addition, the single qubit phase offset gate is applied to the leaf node qubits to obtain the single qubit phase offset sub-circuit, namely, implementing the single qubit phase offset gate on the leaf node qubits.

Step 714: Combine the flip gate sub-circuit, the phase offset gate sub-circuit, the SWAP gate sub-circuit, the leaf phase offset gate sub-circuit, and the single qubit phase offset sub-circuit into a quantum state preparation circuit.

The quantum state preparation circuit refers to the generated quantum state preparation circuit corresponding to the initial vector. When it is necessary to generate a quantum state preparation circuit of other classic data vectors, the quantum state preparation circuit corresponding to other classic data vectors is obtained using other classic data vectors to update parameters in the quantum state preparation circuit.

Specifically, the electronic device combines the flip gate sub-circuit, the phase offset gate sub-circuit, the SWAP gate sub-circuit, the leaf phase offset gate sub-circuit, and the single qubit phase offset sub-circuit to obtain the quantum state preparation circuit.

In the above method for generating a quantum state preparation circuit, by determining a target qubit set with a binary tree restriction and applying the single qubit flip gate to a first target sub-node qubit corresponding to a root node qubit in the target qubit set, a flip gate sub-circuit is obtained; by applying the two-qubit phase offset gate between sub-node qubits corresponding to the root node qubit, a phase offset gate sub-circuit is obtained; by applying the two-qubit SWAP gate between the first target sub-node qubit and a second target sub-node qubit, a SWAP gate sub-circuit is obtained, the second target sub-node qubit being a sub-node qubit of the first target sub-node qubit; by taking the sub-node qubits as the root node qubit and returning to perform the step of the applying the two-qubit phase offset gate between sub-node qubits corresponding to the root node qubit, a phase offset gate sub-circuit is obtained until the sub-node qubits are leaf node qubits; by applying the two-qubit phase offset gate with a path restriction between leaf node qubits corresponding to parent node qubits in the target qubit set, a leaf phase offset gate sub-circuit is obtained, and by applying the single qubit phase offset gate to the leaf node qubits, a single qubit phase offset sub-circuit is obtained; and circuit depths of the target single qubit flip gate, the target single qubit phase offset gate, the target two-qubit SWAP gate, and the target two-qubit phase offset gate with a path restriction are applied to the target qubit with a binary tree restriction. The path restrictions in the binary tree restriction are not intersected, so that the circuit depth of the obtained quantum state preparation circuit can be significantly reduced, thus effectively reducing the circuit depth of the quantum state preparation circuit. Then, using the target quantum state preparation circuit with a reduced circuit depth to prepare a quantum state, the time of preparing a quantum state can be effectively reduced, and the operation efficiency of quantum computation can be increased.

In an embodiment, step 702 of acquiring a two-qubit SWAP gate and a two-qubit phase offset gate with a path restriction includes:

acquiring a single qubit gate and a controlled NOT gate with a path restriction; and combining into the two-qubit SWAP gate and the two-qubit phase offset gate with a path restriction based on the single qubit gate and the controlled NOT gate with a path restriction.

The single qubit gate refers to a quantum gate that performs an operation on one qubit, including but not limited to a single qubit flip gate and a single qubit phase offset. The controlled NOT gate with a path restriction refers to the CNOT gate with a path restriction.

In particular, the electronic device may acquire the single qubit gate and the controlled NOT gate with a path restriction from the database, and then combine the single qubit gate and the controlled NOT gate with a path restriction to obtain the two-qubit SWAP gate and the two-qubit phase offset gate with a path restriction. The combination may be connecting different quantum gates in a connection manner of a quantum circuit. In an embodiment, the electronic device may acquire the required number of single qubit gates and controlled NOT gates with a path restriction based on the number of the single qubit gates and the controlled NOT gates with a path restriction required for establishing the two-qubit SWAP gate, and then combine the respective single qubit gates and controlled NOT gates with a path restriction to obtain the two-qubit SWAP gate. The electronic device may also acquire the required number of single qubit gates and controlled NOT gates with a path restriction based on the number of the single qubit gates and the controlled NOT gates with a path restriction required for establishing the two-qubit phase offset gate with a path restriction, and then combine the respective single qubit gates and controlled NOT gates with a path restriction to obtain the two-qubit phase offset gate with a path restriction.

In an embodiment, the number of qubits in the target qubit set is $2^{n+1}-1$, where n is a positive integer greater than or equal to 1. Specifically, the electronic device acquires $2^n$ qubits, acquires an auxiliary qubit based on the $2^n$ qubits, obtains $2^{n+1}-1$ qubits with a binary tree restriction based on the $2^n$ qubits and the auxiliary qubit, namely, obtaining a target qubit set, and then may prepare $2^n$ qubit quantum states $|\psi_v\rangle$ by $2^n$ quantum state preparation circuits generated by the target qubit set. The auxiliary qubit is a qubit providing an auxiliary use in generating the target qubit set.

In an embodiment, as shown in FIG. 8, the method for generating a quantum state preparation circuit further includes the following steps.

Step 802: Determine three qubits with a binary tree restriction when n is 1.

Step 804: Apply the single qubit flip gate to a first target leaf node qubit corresponding to a root node qubit in the three qubits to obtain a flip gate sub-circuit.

Step 806: Apply the two-qubit phase offset gate between leaf node qubits corresponding to the root node qubit to obtain a phase offset gate sub-circuit.

Step 808: Apply the single qubit phase offset gate to the leaf node qubits to obtain a single qubit phase offset sub-circuit.

Step 810: Combine the flip gate sub-circuit, the phase offset gate sub-circuit, and the single qubit phase offset sub-circuit into a quantum state preparation circuit corresponding to the three qubits.

Specifically, when n is 1, it means that a 2-qubit circuit is generated, and the 2-qubit circuit is used to prepare a 2-qubit quantum state. At this time, the electronic device acquires 1 auxiliary qubit and 2 qubits and determines the three qubits with a binary tree restriction. Then the electronic device applies the single qubit flip gate to the first target leaf node qubit corresponding to the root node qubit in the three qubits to obtain the flip gate sub-circuit. At this moment, if it is determined that the sub-node qubits are leaf node qubits, then the leaf node qubits are directly processed, namely, applying the two-qubit phase offset gate between the leaf node qubits corresponding to the root node qubit to obtain the phase offset gate sub-circuit. Then the single qubit phase offset gate is applied to the leaf node qubits to obtain the single qubit phase offset sub-circuit. Finally, the flip gate sub-circuit, the phase offset gate sub-circuit, and the single qubit phase offset sub-circuit are combined to obtain a quantum state preparation circuit when n=1. When n is greater than 1, the two-qubit SWAP gate is applied between the parent node qubit and the sub-node qubit, the two-qubit phase offset gate is applied between two sub-node qubits corresponding to the parent node qubit, and then a cyclic iteration is continuously performed. Finally, a quantum state preparation circuit when n is greater than 1 is obtained.

In the embodiments described above, the three qubits with a binary tree restriction are determined. Then the single qubit flip gate is applied to the first target leaf node qubit corresponding to the root node qubit in the three qubits to obtain the flip gate sub-circuit. The two-qubit phase offset gate is applied between the leaf node qubits corresponding to the root node qubit to obtain the phase offset gate sub-circuit. The single qubit phase offset gate is applied to the leaf node qubits to obtain the single qubit phase offset sub-circuit. The flip gate sub-circuit, the phase offset gate sub-circuit, and the single qubit phase offset sub-circuit are combined into the quantum state preparation circuit corresponding to the three qubits. That is, by generating the quantum state preparation circuit in a binary tree restriction, the intersection of the path restrictions can be avoided, thus effectively reducing the circuit depth of the quantum state preparation circuit.

In an embodiment, the flip gate sub-circuit has a circuit depth of 1; the phase offset gate sub-circuit has a circuit depth of O (1); the SWAP gate sub-circuit has a circuit depth of 3; the leaf phase offset gate sub-circuit has a circuit depth of O (1); the single qubit phase offset sub-circuit has a circuit depth of 1; and the method further includes:

determining a circuit depth of the quantum state preparation circuit based on circuit depths separately corresponding to the flip gate sub-circuit, the phase offset gate sub-circuit, the SWAP gate sub-circuit, the leaf phase offset gate sub-circuit, and the single qubit phase offset sub-circuit, the circuit depth being O (n).

Specifically, if only one single qubit flip gate is included in the flip gate sub-circuit, the circuit depth is 1. The phase offset gate sub-circuit has a circuit depth of O (1) in a path restriction with a length being 3. The length being 3 means that the path length formed by the root node qubit and the two sub-node qubits is 3. According to the circuit implementation of the SWAP gate $$SWAP_j^i,$$

the SWAP gate sub-circuit has a circuit depth of 3. In a binary tree restriction, the path restrictions formed by the root node qubit and the two sub-node qubits are not intersected, so all the two-qubit phase offset gates can be implemented in parallel, and the depth is still O (1). The single qubit phase offset sub-circuit is composed of the single qubit gates applied to different qubits, so the circuit depth is 1. Finally, the circuit depth of the obtained quantum state preparation circuit is O (n). That is to say, the depth of the generated and unary coded quantum state preparation circuit with a binary tree restriction in the present disclosure is a linear depth. In the present disclosure, any unary coded $2^n$-qubit quantum state $|\psi_v\rangle$ can be prepared by the $2^n$-qubit circuit with a circuit depth of O(n) when only the CNOT gate is allowed to be applied to two qubits with a connected side in the binary tree, i.e., the circuit is in a binary tree restriction. In the present disclosure, the quantum circuit allows only using an arbitrary single qubit gate and CNOT gate. That is to say, by only allowing the CNOT gate to be applied to two qubits with a connected side in the binary tree, the quantum circuits with a path restriction are not intersected, thus significantly reducing the circuit depth of the generated quantum state preparation circuit in the present disclosure.

In an embodiment, the first target sub-node qubit includes a first left sub-node qubit, and the second target sub-node qubit includes a second left sub-node qubit.

Step 704 of applying the single qubit flip gate to a first target sub-node qubit corresponding to a root node qubit in the target qubit set to obtain a flip gate sub-circuit includes:

applying the single qubit flip gate to the first left sub-node qubit corresponding to the root node qubit in the target qubit set to obtain the flip gate sub-circuit.

The first left sub-node qubit refers to a qubit at the left node position in the two sub-nodes corresponding to the root node qubit.

In particular, the electronic device may apply the single qubit flip gate to the first left sub-node qubit to obtain the flip gate sub-circuit, namely, implementing the qubit flip gate on the first left sub-node qubit, namely, performing a qubit flip operation on the first left sub-node position.

Step 708 of applying the two-qubit SWAP gate between the first target sub-node qubit and a second target sub-node qubit to obtain a SWAP gate sub-circuit includes:

applying the two-qubit SWAP gate between the first left sub-node qubit and the second left sub-node qubit to obtain the SWAP gate sub-circuit.

The second left sub-node qubit refers to a qubit at the left node position in the two sub-nodes corresponding to the first left sub-node qubit.

In particular, the electronic device may apply the two-qubit SWAP gate between the first left sub-node qubit and the second left sub-node qubit to obtain the SWAP gate sub-circuit, namely, implementing the two-qubit SWAP gate between the first left sub-node qubit and the second left sub-node qubit, namely, performing a qubit SWAP operation on the first left sub-node qubit and the second left sub-node qubit.

In the above embodiment, when the electronic device applies the single qubit flip gate to the sub-node qubit, the two-qubit SWAP gate is applied between qubits of co-directional nodes to avoid the problem of path intersection in a binary tree restriction, thus improving the accuracy of the obtained quantum circuit.

In an embodiment, the first target sub-node qubit includes a first right sub-node qubit, and the second target sub-node qubit includes a second right sub-node qubit.

Step 704 of applying the single qubit flip gate to a first target sub-node qubit corresponding to a root node qubit in the target qubit set to obtain a flip gate sub-circuit includes:

applying the single qubit flip gate to the first right sub-node qubit corresponding to the root node qubit in the target qubit set to obtain the flip gate sub-circuit.

The first right sub-node qubit refers to a qubit at the right node position in the two sub-nodes corresponding to the root node qubit.

In particular, the electronic device may apply the single qubit flip gate to the first right sub-node qubit to obtain the flip gate sub-circuit, namely, implementing the qubit flip gate on the first right sub-node qubit, namely, performing a qubit flip operation on the first right sub-node position.

Step 708 of applying the two-qubit SWAP gate between the first target sub-node qubit and a second target sub-node qubit to obtain a SWAP gate sub-circuit includes:

applying the two-qubit SWAP gate between the first right sub-node qubit and the second right sub-node qubit to obtain the SWAP gate sub-circuit.

The second right sub-node qubit refers to a qubit at the right node position in the two sub-nodes corresponding to the first right sub-node qubit.

Specifically, when the electronic device applies the two-qubit SWAP gate to the target sub-node qubit, the two-qubit SWAP gate needs to be applied between sub-node qubits at the same position as the target sub-node qubit to ensure the correctness of the obtained SWAP gate sub-circuit, namely, implementing the two-qubit SWAP gate between the first right sub-node qubit and the second right sub-node qubit, namely, performing a qubit SWAP operation on the first right sub-node qubit and the second right sub-node qubit.

In the above embodiment, when the electronic device applies the single qubit flip gate to the sub-node qubit, the two-qubit SWAP gate is applied between qubits of co-directional nodes to avoid the problem of path intersection in a binary tree restriction, thus improving the accuracy of the obtained quantum circuit.

In a specific embodiment, the problem of preparing the unary coded quantum state with a binary tree restriction is specifically defined as follows: given any complex vector $v \in \mathbb{C}^{2^n}$ that satisfies $\|v\|_2=1$ and an initial state $|0\rangle^{\otimes 2n}$, to prepare $2^n$ qubits of quantum states $$|\psi_v\rangle = \sum_{x \in \{0,1\}^n} v_x |e_x\rangle$$

where $e_x$ represents that the value of the qubit numbered x is 1, and the values of other positions are 0. The CNOT gate in the circuit may only be applied to two qubits with edges in the binary tree.

The construction of the unary coded quantum state preparation circuit with a binary tree restriction is illustrated as follows:

The $2^{n+1}-1$ qubits with a binary tree restriction are first numbered:

1. The qubits on the root node of the binary tree are numbered $q_\in$, where $\in$ represents an empty string. The root node of the binary tree is now at level 0 of the binary tree.
2. For any $0 \le k \le n-1$ and $x \in \{0,1\}^k$, on the k level of the binary tree, the left sub-node of the qubit $q_x$ is numbered $q_{x0}$, and the right sub-node is numbered $q_{x1}$.

The initial states of all qubits described above are $|0\rangle$. Any unary quantum state may be as follows:

$$|\psi_v\rangle = \sum_{x \in \{0,1\}^n} e^{i\theta_x} v_x |e_x\rangle,$$

where $\theta_x \in \mathbb{R}$ and $v_x \in \mathbb{R}_{\ge 0}$. For $0 \le k \le n-1$ and $z \in \{0,1\}^k$, it defines that $v_z = \sqrt{(v_{z0})^2 + (v_{z1})_2}$.

The unary coded quantum state preparation circuit with a binary tree restriction is then generated. The construction process is as follows:

Step 0:

Apply the single qubit gate X to the qubit $q_0$.

Step 1:

Step 1.1: Apply the two-qubit phase offset gate $$R_y^{q_0,q_1}(\alpha_\epsilon)$$

in a path restriction of $q_0-q_\in-q_1$, where $\cos(2\alpha_\in)=v_0$ and $\sin(2\alpha_\in)=v_1$.

Step 1.2: Apply the two-qubit SWAP gate $$\mathrm{SWAP}_{q_{00}}^{q_0}$$

on the $q_0$ and $q_{00}$ and apply the SWAP gate $$\mathrm{SWAP}_{q_{10}}^{q_1}$$

on the $q_1$ and $q_{10}$.

Step 2:

Step 2.1: Apply the two-qubit phase offset gate $$R_y^{q_{00},q_{01}}(\alpha_0)$$

in a path restriction of $q_{00}-q_0-q_{01}$, where $\cos(2\alpha_0)=v_{00}/v_0$ and $\sin(2\alpha_0)=v_{01}/v_0$. Apply the two-qubit phase offset gate $$R_y^{q_{00},q_{01}}(\alpha_1)$$

in a path restriction of $q_{10}-q_1-q_{11}$, where $\cos(2\alpha_1)=v_{10}/v_1$ and $\sin(2\alpha_1)=v_{11}/v_1$.

Step 2.2: Apply the two-qubit SWAP gate $$\mathrm{SWAP}_{q_{000}}^{q_{00}}$$

on the $q_{00}$ and the $q_{000}$, the two-qubit SWAP gate $$SWAP_{q_{010}}^{q_{01}}$$

on the $q_{01}$ and the $q_{010}$, the two-qubit SWAP gate $$SWAP_{q_{100}}^{q_{10}}$$

on the $q_{10}$ and the $q_{100}$, and the two-qubit SWAP gate $$SWAP_{q_{110}}^{q_{11}}$$

on the $q_{11}$ and the $q_{110}$.

Step $j(2 \le j \le n-1)$:

Step j. 1: Apply the two-qubit phase offset gate $$R_y^{q_{z0},q_{z1}}(\alpha_z)$$

in a path restriction of $q_{z0}-q_z-q_{z1}$ for all $z \in \{0,1\}^{j-1}$, where $\cos(2\alpha_z)=v_{z0}/v_z$ and $\sin(2\alpha_z)=v_{z1}/v_z$.

Step j. 2: Apply the two-qubit SWAP gate $$SWAP_{q_{z00}}^{q_{z0}}$$

on the $q_{z0}$ and the $q_{z00}$ and apply the two-qubit SWAP gate $$SWAP_{q_{z10}}^{q_{z1}}$$

on the $q_{z1}$ and the $q_{z10}$ for all $z \in \{0,1\}^{j-1}$.

Step n:

Step n.1: Apply the two-qubit phase offset gate $$R_y^{q_{z0},q_{z1}}(\alpha_z)$$

in a path restriction of $q_{z0}$–$q_z$–$q_{z1}$ for all $z\in\{0,1\}^{n-1}$, where $\cos(2\alpha_z)=v_{z0}/v_z$ and $\sin(2\alpha_z)=v_{z1}/v_z$.

Step n.2: Apply the single qubit phase offset gate $R(\theta_x)$ on the $q_x$ for all $x\in\{0,1\}^n$.

The correctness of the above construction of the unary coded quantum state preparation circuit with a binary tree restriction is illustrated. According to the above construction, it can be seen that:

$$\bigotimes_{k\in[n]_0}\bigotimes_{x\in\{0,1\}^k}|0\rangle_{qx}\xrightarrow{Step\ 0}\left(\bigotimes_{k\in[n]_0-\{1\}}\bigotimes_{x\in\{0,1\}^k}|0\rangle_{qx}\right)\otimes|1\rangle_{q0}|0\rangle_{q1}\xrightarrow{Step\ 1.1}$$

$$\left(\bigotimes_{k\in[n]_0-\{1\}}\bigotimes_{x\in\{0,1\}^k}|0\rangle_{qx}\right)\otimes(v_0|1\rangle_{q0}|0\rangle_{q1}+v_0|0\rangle_{q0}|1\rangle_{q1})\xrightarrow{Step\ 1.2}$$

$$\left(\bigotimes_{k\in[n]_0-\{2\}}\bigotimes_{x\in\{0,1\}^k}|0\rangle_{qx}\right)\otimes$$

$$(v_0|1\rangle_{q00}|0\rangle_{q01}|0\rangle_{q10}|0\rangle_{q11}+v_1|0\rangle_{q00}|1\rangle_{q10}|0\rangle_{q11})\xrightarrow{Step\ 2.1}$$

$$\left(\bigotimes_{k\in[n]_0-\{2\}}\bigotimes_{x\in\{0,1\}^k}|0\rangle_{qx}\right)\otimes\left(\sum_{x\in\{0,1\}^2}v_x|0\rangle_{q00}\ \ldots\ |1\rangle_{qx}\ \ldots\ |0\rangle_{q11}\right)\xrightarrow{Step\ 2.2}$$

$$\left(\bigotimes_{k\in[n]_0-\{3\}}\bigotimes_{x\in\{0,1\}^k}|0\rangle_{qx}\right)\otimes\left(\sum_{x\in\{0,1\}^2}v_x|0\rangle_{q000}\ \ldots\ |1\rangle_{qx0}\ \ldots\ |0\rangle_{q111}\right)\xrightarrow{Step\ j.1}$$

$$\left(\bigotimes_{k\in[n]_0-\{j\}}\bigotimes_{x\in\{0,1\}^k}|0\rangle_{qx}\right)\otimes\left(\sum_{x\in\{0,1\}^j}v_x|0\rangle_{q_{\underbrace{0\ldots0}_{j\ bit}}}\ \ldots\ |1\rangle_{qx}\ \ldots\ |0\rangle_{q_{\underbrace{1\ldots1}_{j\ bit}}}\right)\xrightarrow{Step\ j.2}$$

$$\left(\bigotimes_{k\in[n]_0-\{j+1\}}\bigotimes_{x\in\{0,1\}^k}|0\rangle_{qx}\right)\otimes$$

$$\left(\sum_{x\in\{0,1\}^j}v_x|0\rangle_{q_{\underbrace{0\ldots00}_{j+1\ bit}}}\ \ldots\ |1\rangle_{qx0}\ \ldots\ |0\rangle_{q_{\underbrace{0\ldots10}_{j+1\ bit}}}\right)\xrightarrow{Step\ n.1}$$

$$\left(\bigotimes_{k\in[n]_0-\{n\}}\bigotimes_{x\in\{0,1\}^k}|0\rangle_{qx}\right)\otimes\left(\sum_{x\in\{0,1\}^n}v_x|0\rangle_{q_{\underbrace{0\ldots0}_{n\ bit}}}\ \ldots\ |1\rangle_{qx}\ \ldots\ |0\rangle_{q_{\underbrace{1\ldots1}_{n\ bit}}}\right)\xrightarrow{Step\ n.2}$$

$$\left(\bigotimes_{k\in[n]_0-\{n+1\}}\bigotimes_{x\in\{0,1\}^k}|0\rangle_{qx}\right)\otimes\left(\sum_{x\in\{0,1\}^n}v_x|0\rangle_{q_{\underbrace{0\ldots0}_{n\ bit}}}\ \ldots\ |1\rangle_{qx}\ \ldots\ |0\rangle_{q_{\underbrace{1\ldots1}_{n\ bit}}}\right)$$

Finally, a unary coded quantum state is obtained, so the correctness of the quantum circuit is guaranteed.

The circuit depth of the above construction of the unary coded quantum state preparation circuit with a binary tree restriction is illustrated.

1. Step 0: Only one single qubit gate X gate is included with a circuit depth of 1.
2. Step 1: It can be seen from the circuit implementation of the two-qubit rotating gate with a path restriction in the implementation of the four sub-circuits in the present disclosure that in step 1.1, $$R_y^{q_0,q_1}(\alpha_\epsilon)$$

may be implemented by a circuit with a depth of O(1) in a path restriction with a length being 3. It can be seen from the implementation of the two-qubit SWAP gate in the implementation of the four sub-circuits in the present disclosure that step 1.2 may be implemented by a circuit with a depth of 3.

3. Step j ($2\le j\le n-1$): It can be seen from the circuit implementation of the two-qubit rotating gate with a path restriction in the implementation of the four sub-circuits in the present disclosure for all $z\in\{0,1\}^{j-1}$ that the $$R_y^{q_{z0},q_{z1}}(\alpha_z)$$

gate with a path restriction of $q_{z0}$–$q_z$–$q_{z1}$ may be implemented by a circuit with a depth of O(1). Since these path restrictions are not intersected, all the two-qubit rotating gates in step j.1 may be implemented in parallel, and the depth is still O(1). It can be seen from the implementation of the two-qubit SWAP gate in the implementation of the four sub-circuits in the present disclosure that step j.2 may be implemented by a circuit with a depth of 3.

4. Step n: It can be seen from the circuit implementation of the two-qubit rotating gate with a path restriction in the implementation of the four sub-circuits in the present disclosure for all $z\in\{0,1\}^{n-1}$ that the $$R_y^{q_{z0},q_{z1}}(\alpha_z)$$

gate with a path restriction of $q_{z0}$–$q_z$–$q_{z1}$ may be implemented by a circuit with a depth of O(1). Since these path restrictions are not intersected, all the two-qubit rotating gates in step n. 1 may be implemented in parallel, and the depth is still O(1). Since step n. 2 is composed of the single qubit gates applied to different qubits, the circuit depth is 1.

In summary, the unary coded quantum state preparation circuit has a circuit depth of O (n). That is to say, by only allowing the CNOT gate to be applied to two qubits with a connected side in the binary tree, the path restrictions are not intersected, thus significantly reducing the circuit depth of the generated quantum state preparation circuit.

In various embodiments in the present disclosure, ⊗ may be referred as the Kronecker product operator, indicating an operation on two matrices of arbitrary size resulting in a block matrix, wherein when A is an m×n matrix and B is a p×q matrix, the Kronecker product A⊗B is a pm×qn block matrix.

In various embodiments in the present disclosure, "O" may be a big O notation and may be used to indicate an order of approximation, wherein the big O notation characterizes functions according to their growth rates. For non-limiting examples, O(1) may be a constant, O(n) may be linearly depending on n, wherein n is an integer, and $O(n^2)$ may be quadratically depending on n as $n^2$.

In an embodiment, as shown in FIG. 9, after step 714, i.e. after combining the flip gate sub-circuit, the phase offset gate sub-circuit, the SWAP gate sub-circuit, the leaf phase offset gate sub-circuit, and the single qubit phase offset sub-circuit into a quantum state preparation circuit, it further includes:

Step 902: Acquire a target data vector.

The target data vector refers to a vector corresponding to the target data, and the target data is classic data. The classic data may be text data, image data, video data, speech data, and the like. The target data is the data needed to prepare the corresponding quantum state.

In particular, the electronic device acquires the target data vector to prepare the quantum state. The electronic device may acquire the target data vector from the database. The electronic device may also acquire the target data vector uploaded by the terminal. The electronic device may also acquire the target data vector from the service party.

Step 904: Determine a qubit operator based on the target data vector and update a qubit quantum gate in the quantum state preparation circuit based on the qubit operator to obtain a target quantum state preparation circuit corresponding to the target data vector.

The qubit operator is obtained after determining parameters corresponding to the qubit gate according to the target data vector, and the qubit operator includes but is not limited to a two-qubit phase offset operator and a single qubit phase offset operator. The two-qubit phase offset operator is obtained after determining the phase offset parameter corresponding to the two-qubit phase offset gate based on the target data vector. The single qubit phase offset operator is obtained after determining the phase offset parameters corresponding to the single qubit phase offset gate based on the target data vector, and the phase offset parameters are preset parameters, which can be set according to requirements. The target quantum state preparation circuit refers to a quantum state preparation circuit corresponding to the target data vector for preparing a quantum state corresponding to the target data vector.

Specifically, the electronic device determines the qubit operator based on the target data vector and updates the qubit quantum gate in the quantum state preparation circuit using the qubit operator to obtain the target quantum state preparation circuit corresponding to the target data vector. Namely, the electronic device replaces the same qubit quantum gate in the quantum state preparation circuit with the qubit operator corresponding to the target data vector so as to obtain a quantum state preparation circuit updated by the quantum gate, namely, obtaining a target quantum state preparation circuit corresponding to the target data vector.

Step 906: Input a preset initial quantum state to the target quantum state preparation circuit to prepare a quantum state and obtain a quantum state corresponding to the target data vector.

The preset initial quantum state refers to an initial quantum state that is set in advance, and the initial quantum state may be $|0\rangle^{\otimes 2n}$.

Specifically, the electronic device inputs the preset initial quantum state to the target quantum state preparation circuit, the target quantum state preparation circuit performs quantum operation using the qubit operator, and finally the outputted quantum state corresponding to the target data vector is obtained.

In the above embodiments, the qubit operator is determined using the target data vector, the qubit quantum gate in the quantum state preparation circuit is updated based on the qubit operator to obtain the target quantum state preparation circuit corresponding to the target data vector. Then the preset initial quantum state is inputted to the target quantum state preparation circuit to prepare a quantum state and obtain the quantum state corresponding to the target data vector. Namely, using the qubit operator to update the quantum state preparation circuit to obtain the target quantum state preparation circuit and then preparing a quantum state, the efficiency of obtaining the quantum state corresponding to the target data vector is improved.

In an embodiment, as shown in FIG. 10, after combining the flip gate sub-circuit, the phase offset gate sub-circuit, the SWAP gate sub-circuit, the leaf phase offset gate sub-circuit, and the single qubit phase offset sub-circuit into a quantum state preparation circuit, it further includes:

Step 1002: Acquire a recommendation preference data vector.

The recommendation preference data vector refers to a vector corresponding to the recommendation preference data, and the recommendation preference data is used for characterizing preference information about an object to be recommended.

In particular, the electronic device may acquire the recommendation preference data from a recommendation service system and vectorize the recommendation preference data to obtain the recommendation preference data vector.

Step 1004: Determine a qubit operator based on the recommendation preference data vector and update a qubit quantum gate in the quantum state preparation circuit based on the qubit operator to obtain a recommendation quantum state preparation circuit corresponding to the recommendation preference data vector.

The recommendation quantum state preparation circuit is a quantum circuit for preparing the quantum state corresponding to the recommendation preference data vector.

In particular, the electronic device uses the recommendation preference data vector to compute a qubit operator corresponding to obtaining the recommendation preference data vector, including but not limited to a two-qubit phase offset operator and a single qubit phase offset operator. Then, the qubit quantum gate in the quantum state preparation circuit is updated using the qubit operator to obtain the recommendation quantum state preparation circuit corresponding to the recommendation preference data vector. Namely, the electronic device replaces the same qubit quantum gate in the quantum state preparation circuit with the qubit operator corresponding to the recommendation preference data vector so as to obtain a quantum state preparation circuit updated by the quantum gate, namely, obtaining a recommendation quantum state preparation circuit corresponding to the recommendation preference data vector.

Step 1006: Input a preset initial quantum state to the recommendation quantum state preparation circuit to prepare a quantum state and obtain a quantum state corresponding to the recommendation preference data vector.

The preset initial quantum state refers to an initial quantum state that is set in advance, and the initial quantum state may be $|0\rangle^{\otimes 2n}$.

Specifically, the electronic device inputs the preset initial quantum state to the recommendation quantum state preparation circuit, the recommendation quantum state preparation circuit performs quantum operation using the qubit operator, and finally the outputted quantum state corresponding to the recommendation preference data vector is obtained.

Step 1008: Perform quantum operation based on the quantum state corresponding to the recommendation preference data vector and a quantum singular value estimation algorithm circuit to obtain a target quantum state and perform quantum measurement based on the target quantum state to obtain a recommendation result corresponding to the recommendation preference data vector.

The quantum singular value estimation algorithm circuit refers to a quantum circuit corresponding to the quantum singular value estimation algorithm. The target quantum state is the outputted quantum state after performing quantum operation on the quantum state corresponding to the recommendation preference data vector by the quantum singular value estimation algorithm circuit. The quantum measurement will lead to quantum collapse and change uncertainty into certainty. The determination value after collapse may be acquired by the quantum measurement. The recommendation result corresponding to the recommendation preference data vector refers to a result whether to make a recommendation corresponding to the recommendation preference data vector, and the recommendation result includes making a recommendation and not making a recommendation.

Specifically, the electronic device inputs the quantum state corresponding to the recommendation preference data vector to the quantum singular value estimation algorithm circuit to perform quantum operation so as to obtain the outputted target quantum state, and then performs quantum measurement on the target quantum state, namely, performing measurement operation of squaring operation so as to obtain a recommendation result corresponding to the recommendation preference data vector. When the recommendation result indicates to make a recommendation, recommendation information may be transmitted to a recommendation object terminal corresponding to the recommendation preference data. When the recommendation result indicates not to make a recommendation, no processing is performed, i.e., there is no need to transmit the recommendation information to the recommendation object terminal corresponding to the recommendation preference data.

In the above embodiments, the quantum state corresponding to the recommendation preference data vector is obtained using the recommendation preference data vector to prepare a quantum state in the recommendation quantum state preparation circuit. Since the quantum state preparation circuit with a reduced circuit depth is used to prepare a quantum state, the efficiency of obtaining the quantum state corresponding to the recommendation preference data vector is improved. Then the quantum singular value estimation algorithm circuit is used to perform quantum operation to obtain the target quantum state, quantum measurement is performed based on the target quantum state to obtain the recommendation result corresponding to the recommendation preference data vector, and quantum test is performed using the quantum state corresponding to the recommendation preference data vector, thereby improving the efficiency of obtaining the recommendation result.

In a specific embodiment, in a quantum recommendation system, the classic data is a preference matrix $P=[P_{ij}]_{n\times m}$. Before executing the quantum recommendation system, each row of data $P_i=[P_{i1}, P_{i2}, \ldots, P_{im}]$ in the preference matrix needs to be loaded into a corresponding quantum state $$|P_i\rangle = \sum_{j=1}^{m} P_{ij}|j\rangle,$$

where $\{|j\rangle : j=1, \ldots, m\}$ represents a set of orthogonal bases. In addition to the quantum recommendation system, in solving quantum algorithms, such as quantum support vector machine, quantum clustering algorithm, and Hamiltonian simulation in a quantum linear equation, it is also necessary to transform classic data into quantum data by the quantum state preparation circuit.

In an embodiment, as shown in FIG. 11, the method for preparing a quantum state is provided. For example, the method is applied to the electronic device of FIG. 1, and the method includes the following steps.

Step 1102: Acquire a target data vector and acquire a target single qubit flip gate, a target single qubit phase offset gate, a target two-qubit SWAP gate, and a target two-qubit phase offset gate with a path restriction based on the target data vector.

The target data vector refers to a vector corresponding to the target data, and the target data is classic data. The classic data may be text data, image data, video data, speech data, and the like. The target data is the data needed to prepare the corresponding quantum state. The target single qubit flip gate refers to a single qubit flip gate corresponding to the target data vector. The target single qubit phase offset gate refers to a single qubit phase offset gate corresponding to the target data vector. The target two-qubit SWAP gate refers to a two-qubit SWAP gate corresponding to the target data vector. The target two-qubit phase offset gate refers to a two-qubit phase offset gate corresponding to the target data vector.

In particular, the electronic device acquires the target data vector to prepare the quantum state. The electronic device may acquire the target data vector from the database. The electronic device may also acquire the target data vector uploaded by the terminal. The electronic device may also acquire the target data vector from the service party. The target single qubit flip gate, the target single qubit phase offset gate, the target two-qubit SWAP gate, and the target two-qubit phase offset gate with a path restriction are acquired based on the target data vector.

Step 1102: Determine a target qubit set with a binary tree restriction and apply the target single qubit flip gate to a first target sub-node qubit corresponding to a root node qubit in the target qubit set to obtain a target flip gate sub-circuit.

The target flip gate sub-circuit refers to a quantum circuit obtained by applying the target single qubit flip gate to the first target sub-node qubit.

Specifically, the electronic device acquires respective qubits and uses the respective qubits to determine the target qubit set with a binary tree restriction. Then, the target single qubit flip gate is applied to the first target sub-node qubit corresponding to the root node qubit in the target qubit set to obtain the target flip gate sub-circuit. Namely, the target single qubit flip gate is implemented on the first target sub-node qubit corresponding to the root node qubit in the target qubit set.

Step 1104: Apply the target two-qubit phase offset gate between sub-node qubits corresponding to the root node qubit to obtain a target phase offset gate sub-circuit.

The target phase offset gate sub-circuit refers to a quantum circuit obtained by applying the target two-qubit phase offset gate between a qubit in which the left sub-node is located is located and a qubit in which the right sub-node is located of the root node qubit.

Specifically, the electronic device applies the two-qubit phase offset gate with a path restriction between the sub-node qubits corresponding to the root node qubit to obtain the target phase offset gate sub-circuit. Namely, the two-qubit phase offset gate is implemented between the qubit in which the left sub-node is located and the qubit in which the right sub-node is located. Since the two-qubit phase offset gate is implemented by combining the single qubit gate and the CNOT gate with a path restriction, the phase offset gate sub-circuit is obtained by combining the CNOT gate with a path restriction applied between the qubit in which the left sub-node is located and the root node qubit, the CNOT gate with a path restriction applied between the qubit in which the right sub-node is located and the root node qubit, and the single qubit gate applied to the qubit in which the left sub-node is located, the qubit in which the right sub-node is located and the root node qubit.

Step 1106: Apply the target two-qubit SWAP gate between the first target sub-node qubit and a second target sub-node qubit to obtain a target SWAP gate sub-circuit, the second target sub-node qubit being a sub-node qubit of the first target sub-node qubit.

The target SWAP gate sub-circuit refers to a quantum circuit obtained by applying the target two-qubit SWAP gate between the first target sub-node qubit and the second target sub-node qubit.

Specifically, the electronic device applies the target two-qubit SWAP gate between the first target sub-node qubit and the second target sub-node qubit to obtain the target SWAP gate sub-circuit. Namely, the electronic device implements the target two-qubit SWAP gate between the first target sub-node qubit and the second target sub-node qubit.

Step 1108: Take the sub-node qubits as the root node qubit and return to perform the step of the applying the target two-qubit phase offset gate between the sub-node qubits corresponding to the root node qubit to obtain the target phase offset gate sub-circuit until the sub-node qubits are leaf node qubits.

Specifically, the electronic device takes the sub-node qubits as the root node qubit and returns to perform the step of the applying the target two-qubit phase offset gate between the sub-node qubits corresponding to the root node qubit to obtain the target phase offset gate sub-circuit until the sub-node qubits are the leaf node qubits. At this time, the electronic device is completed the iteration, and the iteration is always performed when the sub-node qubits are not the leaf node qubits. When the iteration is completed, the electronic device obtains the respective target phase offset gate sub-circuits and the respective target SWAP gate sub-circuits.

Step 1110: Apply the target two-qubit phase offset gate with a path restriction between leaf node qubits corresponding to parent node qubits in the target qubit set to obtain a target leaf phase offset gate sub-circuit and apply the target single qubit phase offset gate to the leaf node qubits to obtain a target single qubit phase offset sub-circuit.

The target leaf phase offset gate sub-circuit refers to a quantum circuit obtained by applying the target two-qubit phase offset gate with a path restriction between the leaf node qubits corresponding to the parent node qubits. The single qubit phase offset sub-circuit refers to a quantum circuit obtained by applying the target single quantum phase offset gate to the leaf node qubits.

Specifically, in determining that the sub-node qubits are the leaf node qubits, the electronic device applies the target two-qubit phase offset gate with a path restriction to the leaf node qubits corresponding to the parent node qubits in the target qubit set to obtain the target leaf phase offset gate sub-circuit, and applies the target single qubit phase offset gate to the leaf node qubits to obtain the target single qubit phase offset sub-circuit.

Step 1112: Combine the target flip gate sub-circuit, the target phase offset gate sub-circuit, the target SWAP gate sub-circuit, the target leaf phase offset gate sub-circuit, and the target single qubit phase offset sub-circuit into a target quantum state preparation circuit corresponding to the target data vector.

The target quantum state preparation circuit corresponding to the target data vector refers to a quantum state preparation circuit corresponding to the generated target data vector.

Specifically, the electronic device combines the target flip gate sub-circuit, the target phase offset gate sub-circuit, the target SWAP gate sub-circuit, the target leaf phase offset gate sub-circuit, and the target single qubit phase offset sub-circuit into the target quantum state preparation circuit corresponding to the target data vector.

Step 1114: Input a preset initial quantum state to the target quantum state preparation circuit to prepare a quantum state and obtain a quantum state corresponding to the target data vector.

The preset initial quantum state refers to an initial quantum state that is set in advance, and the initial quantum state may be $|0\rangle^{\otimes 2n}$.

Specifically, the electronic device inputs the preset initial quantum state to the target quantum state preparation circuit, the target quantum state preparation circuit performs quantum operation using the qubit operator, and finally the outputted quantum state corresponding to the target data vector is obtained.

In the above method for preparing a quantum state, by acquiring a target single qubit flip gate, a target single qubit phase offset gate, a target two-qubit SWAP gate, and a target two-qubit phase offset gate with a path restriction corresponding to a target data vector, a target quantum state preparation circuit corresponding to the target data vector is generated by a target qubit set with a binary tree restriction and using the target single qubit flip gate, the target single qubit phase offset gate, the target two-qubit SWAP gate, and the target two-qubit phase offset gate with a path restriction. Circuit depths of the target single qubit flip gate, the target single qubit phase offset gate, the target two-qubit SWAP gate, and the target two-qubit phase offset gate with a path restriction are applied to the target qubit with a binary tree restriction. The path restrictions in the binary tree restriction are not intersected, so that the circuit depth of the obtained quantum state preparation circuit can be significantly reduced, thus effectively reducing the circuit depth of the quantum state preparation circuit. Then, by inputting a preset initial quantum state to the target quantum state preparation circuit to prepare a quantum state, a quantum state corresponding to the target data vector is obtained. That is to say, using the target quantum state preparation circuit with a reduced circuit depth to prepare a quantum state, the time of preparing a quantum state can be effectively reduced, and the operation efficiency of quantum computation can be increased, thus improving the efficiency of preparing a quantum state.

In a specific embodiment, the generation of the unary coded quantum state preparation circuit with a binary tree restriction specifically includes: acquiring the vectors to be prepared as follows:

$$v=\left(e^{i\theta_{000}}\frac{\sqrt{6}}{8},\ e^{i\theta_{001}}\frac{\sqrt{6}}{8},\ e^{i\theta_{010}}\frac{\sqrt{3}}{8},\ e^{i\theta_{011}}\frac{1}{8},\ e^{i\theta_{100}}\frac{3\sqrt{2}}{8},\ e^{i\theta_{101}}\frac{\sqrt{6}}{8},\ e^{i\theta_{110}}\frac{3-\sqrt{3}}{8},\ e^{i\theta_{111}}\frac{3+\sqrt{3}}{8}\right)^T\in\mathbb{C}^8$$

The two-qubit operators corresponding to the vectors v to be prepared are acquired as follows:

The qubit operator corresponding to $$R_y^{q_0,q_1}$$

is $$R_y^{q_0,q_1}\left(\frac{2\pi}{3}\right),$$

the qubit operator corresponding to $$R_y^{q_{00},q_{01}}$$

is $$R_y^{q_{00},q_{01}}\left(\frac{\pi}{3}\right),$$

the qubit operator corresponding to $$R_y^{q_{10},q_{11}}$$

is $$R_y^{q_{00},q_{01}}\left(\frac{\pi}{2}\right),$$

the qubit operator corresponding to $$R_y^{q_{000},q_{001}}$$

is $$R_y^{q_{000},q_{001}}\left(\frac{\pi}{2}\right),$$

the qubit operator corresponding to $$R_y^{q_{010},q_{011}}$$

is $$R_y^{q_{010},q_{011}}\left(\frac{\pi}{3}\right),$$

and the qubit operator corresponding to $$R_y^{q_{100},q_{101}}$$

is $$R_y^{q_{010},q_{011}}\left(\frac{5\pi}{6}\right).$$

FIG. 12 shows a schematic illustration of an implementation of a unary coded quantum state preparation circuit corresponding to the vectors v to be prepared, specifically including the following steps.

Step 0: Apply the X gate to the qubit $q_0$.

Step 1:

Step 1.1: Implement the two-qubit rotating gate $$R_y^{q_0,q_1}$$

applied to the $q_0$, $q_1$ in a path restriction of $q_0$–$q_\in$–$q_1$.

Step 1.2: Simultaneously apply the $$SWAP_{q_{00}}^{q_0}$$

on the $q_0$, $q_{00}$ and apply the $$SWAP_{q_{10}}^{q_1}$$

on the $q_1$, $q_{10}$.

Step 2:

Step 2.1: Simultaneously implement the two-qubit rotating gate $$R_y^{q_{00},q_{01}}$$

applied to the $q_{00}$, $q_{01}$ in a path restriction of $q_{00}$–$q_0$–$q_{01}$ and implement the two-qubit rotating gate $$R_y^{q_{10},q_{11}}$$

applied to the $q_{10}$, $q_{11}$ in a path restriction of $q_{10}$–$q_1$–$q_{11}$.

Step 2.2: Simultaneously apply the $$SWAP_{q_{000}}^{q_{00}}$$

on the $q_{00}$, $q_{000}$, the $$SWAP_{q_{010}}^{q_{01}}$$

on the $q_{01}$, $q_{010}$, the $$SWAP_{q_{100}}^{q_{10}}$$

on the $q_{10}$, $q_{100}$, and the $$SWAP_{q_{110}}^{q_{11}}$$

on the $q_{11}$, $q_{110}$.

Step 3:

Step 3.1: Simultaneously implement the two-qubit rotating gate $$R_y^{q_{000},q_{001}}$$

applied to the $q_{000}$, $q_{001}$ in a path restriction of $q_{000}$–$q_{00}$–$q_{001}$, the two-qubit rotating gate $$R_y^{q_{010},q_{011}}$$

applied to the $q_{010}$, $q_{011}$ in a path restriction of $q_{101}$–$q_{01}$–$q_{011}$, the two-qubit rotating gate $$R_y^{q_{100},q_{101}}$$

applied to the $q_{100}$, $q_{101}$ in a path restriction of $q_{100}$–$q_{10}$–$q_{101}$, and the two-qubit rotating gate $$R_y^{q_{110},q_{111}}$$

applied to the $q_{110}$, $q_{111}$ in a path restriction of $q_{110}$–$q_{11}$–$q_{111}$.

Step 3.1: Simultaneously apply the single qubit gate $R(\theta_x)$ on the qubit $q_x$ for all $x \in \{0,1\}^3$.

In summary, the unary coded quantum state preparation circuit corresponding to the vectors v to be prepared is obtained, and the unary coded quantum state preparation circuit has a circuit depth of O(n), thus effectively reducing the circuit depth of the quantum state preparation circuit. Then the preset initial quantum state is inputted to the unary coded quantum state preparation circuit corresponding to the vectors v to be prepared to prepare a quantum state and obtain a quantum state corresponding to the vectors v to be prepared. As such, the time of preparing a quantum state is effectively reduced, and the operation efficiency of quantum computation is increased, thus improving the efficiency of preparing a quantum state.

In a specific embodiment, the method for preparing a quantum state may be applied to a scene of preparing a quantum state corresponding to image data. Specifically, the electronic device acquires the image data and vectorizes the image data to obtain an image vector. Then a quantum state preparation circuit generated by the method for generating a quantum state preparation circuit of the present disclosure is acquired. The image vector is then used to compute the qubit operators, including a two-qubit phase offset operator and a single qubit phase offset operators. The qubit operator is used to update a corresponding quantum gate in the quantum state preparation circuit. For example, the two-qubit phase offset operator can be used to update the two-qubit phase offset gate in the quantum state preparation circuit, and the single qubit phase offset operator can be used to update the single qubit phase offset gate in the quantum state preparation circuit. When all the quantum gates which need to be updated using the qubit operator in the quantum state preparation circuit are updated, the target quantum state preparation circuit corresponding to the image vector is obtained. Finally, the initial quantum state is inputted to the target quantum state preparation circuit corresponding to the image vector to prepare a quantum state and obtain the output of the target quantum state preparation circuit, namely, obtaining the quantum state corresponding to the image vector. The quantum state corresponding to the image vector can be used to perform quantum operation and obtain the processing result of the quantum state corresponding to the image vector, thereby greatly improving the processing efficiency of the image data.

It is understood that, although various steps in the flowcharts involved in the embodiments described above are shown sequentially as indicated by the arrows, these steps are not necessarily performed sequentially in the order indicated by the arrows. These steps are performed in an order which is not strict unless explicitly stated herein, and these steps may be performed in other orders. Moreover, at least some steps in the flowcharts involved in the embodiments described above may include a plurality of steps or stages. The plurality of steps or stages are not necessarily performed at the same time, but may be performed at different times. The order in which the steps or stages are performed may not necessarily be sequential, but may be performed in turn or in alternation with other steps or at least some of the other steps or stages.

Based on the same invention concept, the embodiments of the present disclosure also provide an apparatus for generating a quantum state preparation circuit for implementing the above method for generating a quantum state preparation circuit or a method and apparatus for preparing a quantum state. The solution to the problem provided by the apparatus is similar to the solution described in the above method, and therefore the specific definitions in one or more embodiments of the apparatus for generating a quantum state preparation circuit or the apparatus for preparing a quantum state provided below may refer to the above definitions for the method for generating a quantum state preparation circuit or the method for preparing a quantum state, which will not be described in detail herein.

In an embodiment, as shown in FIG. 13, there is provided an apparatus for generating a quantum state preparation circuit 1300, including: a quantum gate acquisition module 1302, a flip gate action module 1304, a phase offset gate action module 1306, a SWAP gate action module 1308, an iteration module 1310, a leaf node action module 1312, and a combination module 1314.

The quantum gate acquisition module 1302 is configured to acquire a single qubit flip gate, a single qubit phase offset gate, a two-qubit SWAP gate, and a two-qubit phase offset gate with a path restriction.

The flip gate action module 1304 is configured to determine a target qubit set with a binary tree restriction and apply the single qubit flip gate to a first target sub-node qubit corresponding to a root node qubit in the target qubit set to obtain a flip gate sub-circuit.

The phase offset gate action module 1306 is configured to apply the two-qubit phase offset gate between sub-node qubits corresponding to the root node qubit to obtain a phase offset gate sub-circuit.

The SWAP gate action module 1308 is configured to apply the two-qubit SWAP gate between the first target sub-node qubit and a second target sub-node qubit to obtain a SWAP gate sub-circuit, the second target sub-node qubit being a sub-node qubit of the first target sub-node qubit.

The iteration module 1310 is configured to take the sub-node qubits as the root node qubit and return to perform the step of the applying the two-qubit phase offset gate between the sub-node qubits corresponding to the root node qubit to obtain the phase offset gate sub-circuit until the sub-node qubits are leaf node qubits.

The leaf node action module 1312 is configured to apply the two-qubit phase offset gate with a path restriction between leaf node qubits corresponding to parent node qubits in the target qubit set to obtain a leaf phase offset gate sub-circuit and apply the single qubit phase offset gate to the leaf node qubits to obtain a single qubit phase offset sub-circuit.

The combination module 1314 is configured to combine the flip gate sub-circuit, the phase offset gate sub-circuit, the SWAP gate sub-circuit, the leaf phase offset gate sub-circuit, and the single qubit phase offset sub-circuit into a quantum state preparation circuit.

In an embodiment, the quantum gate acquisition module 1302 is further configured to acquire a single qubit gate and a controlled NOT gate with a path restriction; and combine into the two-qubit SWAP gate and the two-qubit phase offset gate with a path restriction based on the single qubit gate and the controlled NOT gate with a path restriction.

In an embodiment, the number of qubits in the target qubit set is $2^{n+1}-1$, where n is a positive integer greater than or equal to 1.

In an embodiment, the apparatus for generating a quantum state preparation circuit 1300 further includes:

a generation module, configured to determine three qubits with a binary tree restriction when the n is 1; apply the single qubit flip gate to a first target leaf node qubit corresponding to a root node qubit in the three qubits to obtain a flip gate sub-circuit; apply the two-qubit phase offset gate between leaf node qubits corresponding to the root node qubit to obtain a phase offset gate sub-circuit; apply the single qubit phase offset gate to the leaf node qubits to obtain a single qubit phase offset sub-circuit; and combine the flip gate sub-circuit, the phase offset gate sub-circuit, and the single qubit phase offset sub-circuit into a quantum state preparation circuit corresponding to the three qubits.

In an embodiment, the flip gate sub-circuit has a circuit depth of 1; the phase offset gate sub-circuit has a circuit depth of O(1); the SWAP gate sub-circuit has a circuit depth of 3; the leaf phase offset gate sub-circuit has a circuit depth of O(1); the single qubit phase offset sub-circuit has a circuit depth of 1; and the apparatus for generating a quantum state preparation circuit 1300 further includes:

a circuit depth determination module, configured to determine a circuit depth of the quantum state preparation circuit based on circuit depths separately corresponding to the flip gate sub-circuit, the phase offset gate sub-circuit, the SWAP gate sub-circuit, the leaf phase offset gate sub-circuit, and the single qubit phase offset sub-circuit, the circuit depth being O(n).

In an embodiment, the first target sub-node qubit includes a first left sub-node qubit, and the second target sub-node qubit includes a second left sub-node qubit.

The flip gate action module 1304 is further configured to apply the single qubit flip gate to the first left sub-node qubit corresponding to the root node qubit in the target qubit set to obtain the flip gate sub-circuit.

The SWAP gate action module 1308 is further configured to apply the two-qubit SWAP gate between the first left sub-node qubit and the second left sub-node qubit to obtain the SWAP gate sub-circuit.

In an embodiment, the first target sub-node qubit includes a first right sub-node qubit, and the second target sub-node qubit includes a second right sub-node qubit.

The flip gate action module 1304 is further configured to apply the single qubit flip gate to the first right sub-node qubit corresponding to the root node qubit in the target qubit set to obtain the flip gate sub-circuit.

The SWAP gate action module 1308 is further configured to apply the two-qubit SWAP gate between the first right sub-node qubit and the second right sub-node qubit to obtain the SWAP gate sub-circuit.

In an embodiment, the apparatus for generating a quantum state preparation circuit 1300 further includes:

a quantum state preparation module, configured to acquire a target data vector; determine a qubit operator based on the target data vector and update a qubit quantum gate in the quantum state preparation circuit based on the qubit operator to obtain a target quantum state preparation circuit corresponding to the target data vector; and input a preset initial quantum state to the target quantum state preparation circuit to prepare a quantum state and obtain a quantum state corresponding to the target data vector.

In an embodiment, the apparatus for generating a quantum state preparation circuit 1300 further includes:

a quantum recommendation module, configured to acquire a recommendation preference data vector; determine a qubit operator based on the recommendation preference data vector and update a qubit quantum gate in the quantum state preparation circuit based on the qubit operator to obtain a recommendation quantum state preparation circuit corresponding to the recommendation preference data vector; input a preset initial quantum state to the recommendation quantum state preparation circuit to prepare a quantum state and obtain a quantum state corresponding to the recommendation preference data vector; and perform quantum operation based on the quantum state corresponding to the recommendation preference data vector and a quantum singular value estimation algorithm circuit to obtain a target quantum state and perform quantum measurement based on the target quantum state to obtain a recommendation result corresponding to the recommendation preference data vector.

In an embodiment, as shown in FIG. 14, there is provided an apparatus for preparing a quantum state 1400, including: a target quantum gate acquisition module 1402, a target flip gate action module 1404, a target phase offset gate action module 1406, a target SWAP gate action module 1408, a target iteration module 1410, a target leaf node action module 1412, a target combination module 1414, and a preparation module 1416.

The target quantum gate acquisition module 1402 is configured to acquire a target data vector and acquire a target single qubit flip gate, a target single qubit phase offset gate, a target two-qubit SWAP gate, and a target two-qubit phase offset gate with a path restriction based on the target data vector.

The target flip gate action module 1404 is configured to determine a target qubit set with a binary tree restriction and apply the target single qubit flip gate to a first target sub-node qubit corresponding to a root node qubit in the target qubit set to obtain a target flip gate sub-circuit.

The target phase offset gate action module 1406 is configured to apply the target two-qubit phase offset gate between sub-node qubits corresponding to the root node qubit to obtain a target phase offset gate sub-circuit.

The target SWAP gate action module 1408 is configured to apply the target two-qubit SWAP gate between the first target sub-node qubit and a second target sub-node qubit to obtain a target SWAP gate sub-circuit, the second target sub-node qubit being a sub-node qubit of the first target sub-node qubit.

The target iteration module 1410 is configured to take the sub-node qubits as the root node qubit and return to perform the step of the applying the target two-qubit phase offset gate between the sub-node qubits corresponding to the root node qubit to obtain the target phase offset gate sub-circuit until the sub-node qubits are leaf node qubits.

The target leaf node action module 1412 is configured to apply the target two-qubit phase offset gate with a path restriction between leaf node qubits corresponding to parent node qubits in the target qubit set to obtain a target leaf phase offset gate sub-circuit and apply the target single qubit phase offset gate to the leaf node qubits to obtain a target single qubit phase offset sub-circuit.

The target combination module 1414 is configured to combine the target flip gate sub-circuit, the target phase offset gate sub-circuit, the target SWAP gate sub-circuit, the target leaf phase offset gate sub-circuit, and the target single qubit phase offset sub-circuit into a target quantum state preparation circuit corresponding to the target data vector.

The preparation module 1416 is configured to input a preset initial quantum state to the target quantum state preparation circuit to prepare a quantum state and obtain a quantum state corresponding to the target data vector.

The modules in the above apparatus for generating a quantum state preparation circuit or the apparatus for preparing a quantum state may be implemented in whole or in part by software, hardware, and a combination thereof. The above modules may be embedded in the form of hardware or independent from the processor in the electronic device, and may also be stored in the memory in the electronic device in the form of software, so that the processor calls to perform the corresponding operations of the above modules.

In an embodiment, an electronic device is provided. The electronic device may be an industrial intelligent device, and the internal structure thereof may be as shown in FIG. 15. The electronic device includes a processor, a memory, an input/output (I/O) interface, and a communication interface. The processor, the memory and the I/O interface are connected via a system bus, and the communication interface is connected to the system bus via the I/O interface. The processor of the electronic device is configured to provide computation and control capabilities. The memory of the electronic device includes a non-volatile storage medium and an internal memory. The non-volatile storage medium stores an operating system, a computer-readable instruction, and a database. The internal memory provides an environment for the operation of the operating system and the computer-readable instruction in the non-volatile storage medium. The database of the electronic device is used for storing the target data vector. The I/O interface of the electronic device is used for exchanging information between the processor and an external device. The communication interface of the electronic device is used for communicating with an external terminal via a network connection. The computer-readable instruction, when executed by the processor, performs a method for generating a quantum state preparation circuit or a method for preparing a quantum state.

It will be understood by those skilled in the art that the structures shown in FIG. 15 are only a block diagram of a portion structure related to the schemes of the present disclosure and do not limit the electronic device applied to the present disclosure. The specific electronic device may include more or fewer components than the illustration in the drawings, or some components may be combined, or a different arrangement of components may be employed.

In an embodiment, there is provided a quantum chip, including a quantum state preparation circuit, the quantum state preparation circuit being implemented by the method for generating a quantum state preparation circuit of the present disclosure. The quantum chip may be applied to various intelligent terminals and vehicle-mounted devices.

In an embodiment, there is also provided an electronic device, including a memory and a processor, the memory storing a computer-readable instruction which, when executed by the processor, performs the steps of the method embodiments described above.

In an embodiment, there is provided a computer-readable storage medium, having stored thereon a computer-readable instruction which, when executed by a processor, performs the steps of the method embodiments described above.

In an embodiment, there is provided a non-transitory computer program product, including a computer-readable instruction which, when executed by a processor, performs the steps of the method embodiments described above.

The user information (including but not limited to user equipment information and user personal information) and data (including but not limited to data used for analysis, stored data, and displayed data) involved in the present disclosure are both information and data authorized by the user or fully authorized by all parties. In addition, the collection, use, and processing of the relevant data needs to comply with the relevant laws, regulations, and standards of the relevant countries and regions. The recommended information, and the recommendation object terminal can reject or conveniently reject advertisement recommendation information and the like.

In various embodiments in the present disclosure, a module may refer to a software module, a hardware module, or a combination thereof. A software module may include a computer program or part of the computer program that has a predefined function and works together with other related parts to achieve a predefined goal, such as those functions described in this disclosure. A hardware module may be implemented using processing circuitry and/or memory configured to perform the functions described in this disclosure. Each module can be implemented using one or more processors (or processors and memory). Likewise, a processor (or processors and memory) can be used to implement one or more modules. Moreover, each module can be part of an overall module that includes the functionalities of the module. The description here also applies to the term module and other equivalent terms.

It will be appreciated by those skilled in the art that the implementation of all or part of the flows in the above method embodiments can be completed by instructing the relevant hardware by the computer-readable instruction. The computer-readable instruction can be stored in a non-volatile computer-readable storage medium. When executed, the computer-readable instruction can include the flows in the embodiments of the above methods. Any references to the memory, database, or other medium used in the embodiments provided in the present disclosure may include at least one of a non-volatile (or non-transitory) memory and a volatile memory. The non-volatile memory may include a read-only memory (ROM), a magnetic tape, a floppy disk, a flash memory, an optical memory, a high-density embedded non-volatile memory, a ReRAM, a magnetoresistive random access memory (MRAM), a ferroelectric random access memory (FRAM), a phase change memory (PCM), and a graphene memory. The volatile memory may include a random access memory (RAM) or external cache memory. For illustration, but not for limitation, the RAM may be in a variety of forms, such as a static random access memory (SRAM) or a dynamic random access memory (DRAM). The database involved in the embodiments provided in the present disclosure may include at least one of a relational database and a non-relational database. The non-relational database may include, but is not limited to a distributed database based on a blockchain. The processor involved in the embodiments provided in the present disclosure may be, but is not limited to a general purpose processor, a CPU, a graphics processor, a digital signal processor, a programmable logic device, and a data processing logic device based on quantum computation.

The technical features of the above embodiments may be combined in any combination. To make the description concise, not all the possible combinations of the technical features in the above embodiments are described. As long as there is no contradiction between the combinations of these technical features, they are considered as within the scope of the specification.

The embodiments described above represent only several embodiments of the present disclosure and are described in more detail. However, they are not construed as limiting the scope of the present disclosure. It will be appreciated by those skilled in the art that various changes and modifications may be made to the present disclosure without departing from the spirit and scope of protection of the present disclosure. Accordingly, the scope of protection of the present disclosure is as set forth in the appended claims.

What is claimed is:

1. A method for generating a quantum state preparation circuit, executed by an electronic device, comprising:

acquiring a single qubit flip gate, a single qubit phase offset gate, a two-qubit SWAP gate, and a two-qubit phase offset gate with a path restriction;

determining a target qubit set with a binary tree restriction and applying the single qubit flip gate to a first target sub-node qubit corresponding to a root node qubit in the target qubit set to obtain a flip gate sub-circuit;

applying the two-qubit phase offset gate between sub-node qubits corresponding to the root node qubit to obtain a phase offset gate sub-circuit;

applying the two-qubit SWAP gate between the first target sub-node qubit and a second target sub-node qubit to obtain a SWAP gate sub-circuit, the second target sub-node qubit being a sub-node qubit of the first target sub-node qubit;

taking a sub-node qubit of the root node qubit as a next root node qubit and performing the applying the two-qubit phase offset gate between sub-node qubits corresponding to the next root node qubit to obtain a phase offset gate sub-circuit until the sub-node qubits are leaf node qubits;

applying the two-qubit phase offset gate with a path restriction between leaf node qubits corresponding to parent node qubits in the target qubit set to obtain a leaf phase offset gate sub-circuit and applying the single qubit phase offset gate to the leaf node qubits to obtain a single qubit phase offset sub-circuit; and combining the flip gate sub-circuit, the phase offset gate sub-circuit, the SWAP gate sub-circuit, the leaf phase offset gate sub-circuit, and the single qubit phase offset sub-circuit into a quantum state preparation circuit.

2. The method according to claim 1, wherein the acquiring the two-qubit SWAP gate and the two-qubit phase offset gate with the path restriction comprises:

acquiring a single qubit gate and a controlled NOT (CNOT) gate with a path restriction; and combining into the two-qubit SWAP gate and the two-qubit phase offset gate with the path restriction based on the single qubit gate and the CNOT gate with the path restriction.

3. The method according to claim 1, wherein the number of qubits in the target qubit set is 2^(n+1)−1, the n being a positive integer greater than or equal to 1.

4. The method according to claim 3, further comprising:

determining three qubits with a binary tree restriction when the n is 1;

applying the single qubit flip gate to a first target leaf node qubit corresponding to a root node qubit in the three qubits to obtain a flip gate sub-circuit;

applying the two-qubit phase offset gate between leaf node qubits corresponding to the root node qubit to obtain a phase offset gate sub-circuit;

applying the single qubit phase offset gate to the leaf node qubits to obtain a single qubit phase offset sub-circuit; and combining the flip gate sub-circuit, the phase offset gate sub-circuit, and the single qubit phase offset sub-circuit into a quantum state preparation circuit corresponding to the three qubits.

5. The method according to claim 3, wherein:

the flip gate sub-circuit has a circuit depth of 1;

the phase offset gate sub-circuit has a circuit depth of O (1);

the SWAP gate sub-circuit has a circuit depth of 3;

the leaf phase offset gate sub-circuit has a circuit depth of O (1);

the single qubit phase offset sub-circuit has a circuit depth of 1; and the method further comprises:

determining a circuit depth of the quantum state preparation circuit based on circuit depths separately corresponding to the flip gate sub-circuit, the phase offset gate sub-circuit, the SWAP gate sub-circuit, the leaf phase offset gate sub-circuit, and the single qubit phase offset sub-circuit, the circuit depth being O (n).

6. The method according to claim 1, wherein:

the first target sub-node qubit comprises a first left sub-node qubit, and the second target sub-node qubit comprises a second left sub-node qubit;

the applying the single qubit flip gate to the first target sub-node qubit corresponding to the root node qubit in the target qubit set to obtain the flip gate sub-circuit comprises:

applying the single qubit flip gate to the first left sub-node qubit corresponding to the root node qubit in the target qubit set to obtain the flip gate sub-circuit; and the applying the two-qubit SWAP gate between the first target sub-node qubit and the second target sub-node qubit to obtain the SWAP gate sub-circuit comprises:

applying the two-qubit SWAP gate between the first left sub-node qubit and the second left sub-node qubit to obtain the SWAP gate sub-circuit.

7. The method according to claim 1, wherein:

the first target sub-node qubit comprises a first right sub-node qubit, and the second target sub-node qubit comprises a second right sub-node qubit;

the applying the single qubit flip gate to the first target sub-node qubit corresponding to the root node qubit in the target qubit set to obtain the flip gate sub-circuit comprises:

applying the single qubit flip gate to the first right sub-node qubit corresponding to the root node qubit in the target qubit set to obtain the flip gate sub-circuit; and the applying the two-qubit SWAP gate between the first target sub-node qubit and the second target sub-node qubit to obtain the SWAP gate sub-circuit comprises:

applying the two-qubit SWAP gate between the first right sub-node qubit and the second right sub-node qubit to obtain the SWAP gate sub-circuit.

8. The method according to claim 1, wherein after the combining the flip gate sub-circuit, the phase offset gate sub-circuit, the SWAP gate sub-circuit, the leaf phase offset gate sub-circuit, and the single qubit phase offset sub-circuit into the quantum state preparation circuit, the method further comprises:

acquiring a target data vector;

determining a qubit operator based on the target data vector and updating a qubit quantum gate in the quantum state preparation circuit based on the qubit operator to obtain a target quantum state preparation circuit corresponding to the target data vector; and inputting a preset initial quantum state to the target quantum state preparation circuit to prepare a quantum state and obtain a quantum state corresponding to the target data vector.

9. The method according to claim 1, wherein after the combining the flip gate sub-circuit, the phase offset gate sub-circuit, the SWAP gate sub-circuit, the leaf phase offset gate sub-circuit, and the single qubit phase offset sub-circuit into the quantum state preparation circuit, the method further comprises:

acquiring a recommendation preference data vector;

determining a qubit operator based on the recommendation preference data vector and updating a qubit quantum gate in the quantum state preparation circuit based on the qubit operator to obtain a recommendation quantum state preparation circuit corresponding to the recommendation preference data vector;

inputting a preset initial quantum state to the recommendation quantum state preparation circuit to prepare a quantum state and obtain a quantum state corresponding to the recommendation preference data vector; and performing quantum operation based on the quantum state corresponding to the recommendation preference data vector and a quantum singular value estimation algorithm circuit to obtain a target quantum state and performing quantum measurement based on the target quantum state to obtain a recommendation result corresponding to the recommendation preference data vector.

10. An apparatus for generating a quantum state preparation circuit, the apparatus comprising:

a memory storing instructions; and a processor in communication with the memory, wherein, when the processor executes the instructions, the processor is configured to cause the apparatus to perform:

acquiring a single qubit flip gate, a single qubit phase offset gate, a two-qubit SWAP gate, and a two-qubit phase offset gate with a path restriction;

determining a target qubit set with a binary tree restriction and applying the single qubit flip gate to a first target sub-node qubit corresponding to a root node qubit in the target qubit set to obtain a flip gate sub-circuit;

applying the two-qubit phase offset gate between sub-node qubits corresponding to the root node qubit to obtain a phase offset gate sub-circuit;

applying the two-qubit SWAP gate between the first target sub-node qubit and a second target sub-node qubit to obtain a SWAP gate sub-circuit, the second target sub-node qubit being a sub-node qubit of the first target sub-node qubit;

taking a sub-node qubit of the root node qubit as a next root node qubit and performing the applying the two-qubit phase offset gate between sub-node qubits corresponding to the next root node qubit to obtain a phase offset gate sub-circuit until the sub-node qubits are leaf node qubits;

applying the two-qubit phase offset gate with a path restriction between leaf node qubits corresponding to parent node qubits in the target qubit set to obtain a leaf phase offset gate sub-circuit and applying the single qubit phase offset gate to the leaf node qubits to obtain a single qubit phase offset sub-circuit; and combining the flip gate sub-circuit, the phase offset gate sub-circuit, the SWAP gate sub-circuit, the leaf phase offset gate sub-circuit, and the single qubit phase offset sub-circuit into a quantum state preparation circuit.

11. The apparatus according to claim 10, wherein, when the processor is configured to cause the apparatus to perform acquiring the two-qubit SWAP gate and the two-qubit phase offset gate with the path restriction, the processor is configured to cause the apparatus to perform:

acquiring a single qubit gate and a controlled NOT (CNOT) gate with a path restriction; and combining into the two-qubit SWAP gate and the two-qubit phase offset gate with the path restriction based on the single qubit gate and the CNOT gate with the path restriction.

12. The apparatus according to claim 10, wherein the number of qubits in the target qubit set is 2^(n+1)−1, the n being a positive integer greater than or equal to 1.

13. The apparatus according to claim 10, wherein:

the first target sub-node qubit comprises a first left sub-node qubit, and the second target sub-node qubit comprises a second left sub-node qubit;

when the processor is configured to cause the apparatus to perform applying the single qubit flip gate to the first target sub-node qubit corresponding to the root node qubit in the target qubit set to obtain the flip gate sub-circuit, the processor is configured to cause the apparatus to perform:

applying the single qubit flip gate to the first left sub-node qubit corresponding to the root node qubit in the target qubit set to obtain the flip gate sub-circuit; and when the processor is configured to cause the apparatus to perform applying the two-qubit SWAP gate between the first target sub-node qubit and the second target sub-node qubit to obtain the SWAP gate sub-circuit, the processor is configured to cause the apparatus to perform:

applying the two-qubit SWAP gate between the first left sub-node qubit and the second left sub-node qubit to obtain the SWAP gate sub-circuit.

14. The apparatus according to claim 10, wherein:

the first target sub-node qubit comprises a first right sub-node qubit, and the second target sub-node qubit comprises a second right sub-node qubit;

when the processor is configured to cause the apparatus to perform applying the single qubit flip gate to the first target sub-node qubit corresponding to the root node qubit in the target qubit set to obtain the flip gate sub-circuit, the processor is configured to cause the apparatus to perform:

applying the single qubit flip gate to the first right sub-node qubit corresponding to the root node qubit in the target qubit set to obtain the flip gate sub-circuit; and when the processor is configured to cause the apparatus to perform applying the two-qubit SWAP gate between the first target sub-node qubit and the second target sub-node qubit to obtain the SWAP gate sub-circuit, the processor is configured to cause the apparatus to perform:

applying the two-qubit SWAP gate between the first right sub-node qubit and the second right sub-node qubit to obtain the SWAP gate sub-circuit.

15. The apparatus according to claim 10, wherein, after the processor is configured to cause the apparatus to perform combining the flip gate sub-circuit, the phase offset gate sub-circuit, the SWAP gate sub-circuit, the leaf phase offset gate sub-circuit, and the single qubit phase offset sub-circuit into the quantum state preparation circuit, the processor is configured to further cause the apparatus to perform:

acquiring a target data vector;

determining a qubit operator based on the target data vector and updating a qubit quantum gate in the quantum state preparation circuit based on the qubit operator to obtain a target quantum state preparation circuit corresponding to the target data vector; and inputting a preset initial quantum state to the target quantum state preparation circuit to prepare a quantum state and obtain a quantum state corresponding to the target data vector.

16. The apparatus according to claim 10, wherein, after the processor is configured to cause the apparatus to perform combining the flip gate sub-circuit, the phase offset gate sub-circuit, the SWAP gate sub-circuit, the leaf phase offset gate sub-circuit, and the single qubit phase offset sub-circuit into the quantum state preparation circuit, the processor is configured to further cause the apparatus to perform:

acquiring a recommendation preference data vector;

determining a qubit operator based on the recommendation preference data vector and updating a qubit quantum gate in the quantum state preparation circuit based on the qubit operator to obtain a recommendation quantum state preparation circuit corresponding to the recommendation preference data vector;

inputting a preset initial quantum state to the recommendation quantum state preparation circuit to prepare a quantum state and obtain a quantum state corresponding to the recommendation preference data vector; and performing quantum operation based on the quantum state corresponding to the recommendation preference data vector and a quantum singular value estimation algorithm circuit to obtain a target quantum state and performing quantum measurement based on the target quantum state to obtain a recommendation result corresponding to the recommendation preference data vector.

17. A non-transitory computer-readable storage medium, storing computer-readable instructions, wherein, the computer-readable instructions, when executed by a processor, are configured to cause the processor to perform:

acquiring a single qubit flip gate, a single qubit phase offset gate, a two-qubit SWAP gate, and a two-qubit phase offset gate with a path restriction;

determining a target qubit set with a binary tree restriction and applying the single qubit flip gate to a first target sub-node qubit corresponding to a root node qubit in the target qubit set to obtain a flip gate sub-circuit;

applying the two-qubit phase offset gate between sub-node qubits corresponding to the root node qubit to obtain a phase offset gate sub-circuit;

applying the two-qubit SWAP gate between the first target sub-node qubit and a second target sub-node qubit to obtain a SWAP gate sub-circuit, the second target sub-node qubit being a sub-node qubit of the first target sub-node qubit;

taking a sub-node qubit of the root node qubit as a next root node qubit and performing the applying the two-qubit phase offset gate between sub-node qubits corresponding to the next root node qubit to obtain a phase offset gate sub-circuit until the sub-node qubits are leaf node qubits;

applying the two-qubit phase offset gate with a path restriction between leaf node qubits corresponding to parent node qubits in the target qubit set to obtain a leaf phase offset gate sub-circuit and applying the single qubit phase offset gate to the leaf node qubits to obtain a single qubit phase offset sub-circuit; and combining the flip gate sub-circuit, the phase offset gate sub-circuit, the SWAP gate sub-circuit, the leaf phase offset gate sub-circuit, and the single qubit phase offset sub-circuit into a quantum state preparation circuit.

18. The non-transitory computer-readable storage medium according to claim 17, wherein, when the computer-readable instructions are configured to cause the processor to perform acquiring the two-qubit SWAP gate and the two-qubit phase offset gate with the path restriction, the computer-readable instructions are configured to cause the processor to perform:

acquiring a single qubit gate and a controlled NOT (CNOT) gate with a path restriction; and combining into the two-qubit SWAP gate and the two-qubit phase offset gate with the path restriction based on the single qubit gate and the CNOT gate with the path restriction.

19. The non-transitory computer-readable storage medium according to claim 17, wherein the number of qubits in the target qubit set is 2^(n+1)−1, the n being a positive integer greater than or equal to 1.

20. The non-transitory computer-readable storage medium according to claim 17, wherein:

the first target sub-node qubit comprises a first left sub-node qubit, and the second target sub-node qubit comprises a second left sub-node qubit;

when the computer-readable instructions are configured to cause the processor to perform applying the single qubit flip gate to the first target sub-node qubit corresponding to the root node qubit in the target qubit set to obtain the flip gate sub-circuit, the computer-readable instructions are configured to cause the processor to perform:

applying the single qubit flip gate to the first left sub-node qubit corresponding to the root node qubit in the target qubit set to obtain the flip gate sub-circuit; and when the computer-readable instructions are configured to cause the processor to perform applying the two-qubit SWAP gate between the first target sub-node qubit and the second target sub-node qubit to obtain the SWAP gate sub-circuit, the computer-readable instructions are configured to cause the processor to perform:

applying the two-qubit SWAP gate between the first left sub-node qubit and the second left sub-node qubit to obtain the SWAP gate sub-circuit.

* * * * *